United States Patent
Maeda et al.

[11] Patent Number: 6,124,619
[45] Date of Patent: *Sep. 26, 2000

[54] SEMICONDUCTOR DEVICE INCLUDING UPPER, LOWER AND SIDE OXIDATION-RESISTANT FILMS

[75] Inventors: Shigenobu Maeda; Shigeto Maegawa; Takashi Ipposhi; Yasuo Yamaguchi; Toshiaki Iwamatsu, all of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/877,202

[22] Filed: Jun. 17, 1997

[30] Foreign Application Priority Data

Nov. 27, 1996 [JP] Japan .................................. 8-316348

[51] Int. Cl.⁷ .......................... H01L 29/76; H01L 29/94; H01L 31/062; H01L 31/113
[52] U.S. Cl. ...................... 257/411; 257/409; 257/410
[58] Field of Search .................... 257/347, 508, 257/314, 315, 630, 411, 640, 649, 410, 409; 438/595, 454, 184, 696, 267, 265, 261, 303

[56] References Cited

U.S. PATENT DOCUMENTS

| | | | |
|---|---|---|---|
| 4,332,078 | 6/1982 | Peek et al. ........................... | 29/580 |
| 4,593,454 | 6/1986 | Baudrant et al. ..................... | 29/571 |
| 4,994,893 | 2/1991 | Ozake et al. ......................... | 257/306 |
| 5,067,000 | 11/1991 | Eimori et al. ....................... | 257/508 |
| 5,225,704 | 7/1993 | Wakamiya et al. . | |
| 5,225,705 | 7/1993 | Hiyama et al. ...................... | 257/415 |
| 5,545,578 | 8/1996 | Park et al. ........................... | 437/44 |
| 5,610,099 | 3/1997 | Stevens et al. ...................... | 438/626 |
| 5,641,989 | 6/1997 | Tomioka ............................. | 257/315 |
| 5,710,453 | 1/1998 | Bryant ................................ | 257/411 |
| 5,714,787 | 2/1998 | Eguchi et al. ....................... | 257/394 |
| 5,747,845 | 5/1998 | Iwasa .................................. | 257/306 |
| 5,754,464 | 5/1998 | Tomioka ............................. | 257/390 |
| 5,762,813 | 6/1998 | Takiyama et al. . . | |
| 5,766,996 | 6/1998 | Hayakawa et al. ................. | 438/257 |
| 5,814,553 | 9/1998 | Chuang et al. ..................... | 438/595 |

FOREIGN PATENT DOCUMENTS

| | | |
|---|---|---|
| 0 718 881 | 6/1996 | European Pat. Off. . |
| 39 42 648 | 6/1990 | Germany . |
| 4-105328 | 4/1992 | Japan . |
| 6-283599 | 10/1994 | Japan . |
| 6-302779 | 10/1994 | Japan . |
| 7-74363 | 3/1995 | Japan . |
| 7-273185 | 10/1995 | Japan . |
| 7-283300 | 10/1995 | Japan . |
| 8-031928 | 2/1996 | Japan . |

OTHER PUBLICATIONS

T. Iwamatsu, et al., "CAD–Compatible High–Speed CMOS/SIMOX Technology Using Field–Shield Isolation for 1M Gate Array", IEEE/IEDM, (1993), pp. 475–478.

(List continued on next page.)

*Primary Examiner*—Olik Chaudhuri
*Assistant Examiner*—Phat X. Cao
*Attorney, Agent, or Firm*—Oblon, Spivak, McClelland, Maier & Neustadt, P.C.

[57] ABSTRACT

In order to improve isolation between an FS (field shielding) electrode and a gate electrode (6), upper and lower major surfaces of a polysilicon layer (35) forming a principal part of an FS electrode (5) are covered with nitride films (SiN films) (34, 36) respectively. Therefore, it is possible to inhibit portions in the vicinity of edge portions of the polysilicon layer (35) from being oxidized by an oxidant following oxidation for forming a gate insulating film (14). Thus, the polysilicon layer (35) is inhibited from deformation following oxidation, whereby the distance between an FS electrode (5) and a gate electrode (6) is sufficiently ensured. Consequently, isolation between the FS electrode (5) and the gate electrode (6) is improved.

4 Claims, 22 Drawing Sheets

OTHER PUBLICATIONS

T. Iwamatsu, et al., "High–Speed 0.5μm SOI 1/8 Frequency Divider with Body–Fixed Structure for Wide Range of Applications", Extended Abstracts of the 1995 International Conference on Solid State Devices and Materials, (Osaka, Japan, 1995), pp. 575–577.

Patent Abstract of Japan, vol. 005, No. 044 (E–050), Mar. 24, 1991, JP 56–001546, Jan. 9, 1981.

S.A. Abbas, IBM Technical Disclosure Bulletin, vol. 15, No. 10, pp. 3022–3023, "FET Integrated Circuit Having Two Polysilicon Layers," Mar. 1973.

Patent Abstracts of Japan, vol. 096, No. 006, Jun. 28, 1996, JP 08 051145, Feb., 20, 1996.

BACKGROUND ART FIG. 52
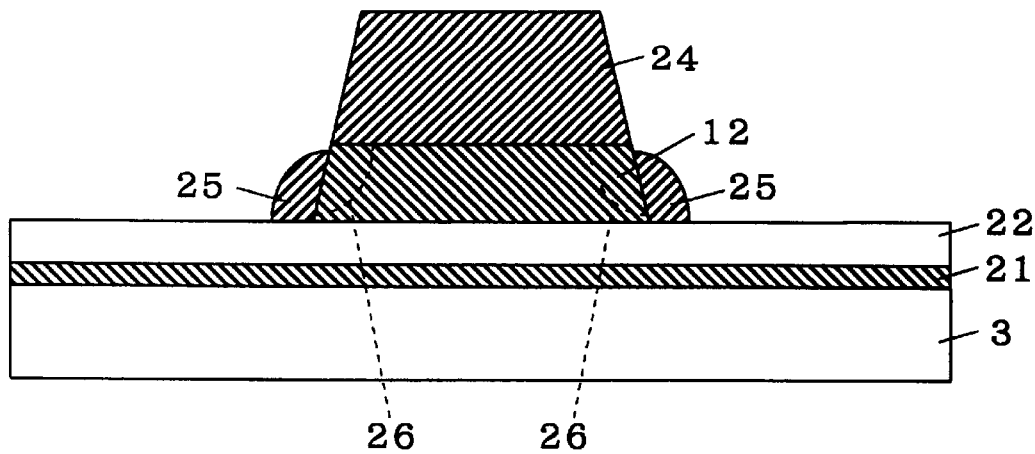
BACKGROUND ART FIG. 53
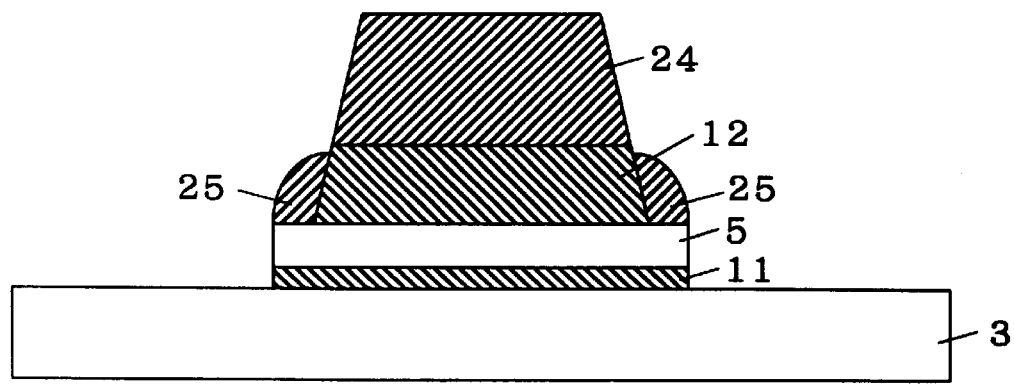
BACKGROUND ART FIG. 54
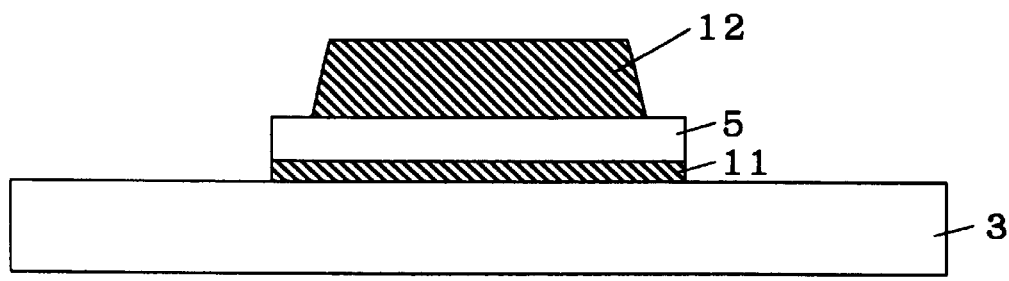

BACKGROUND ART FIG. 55
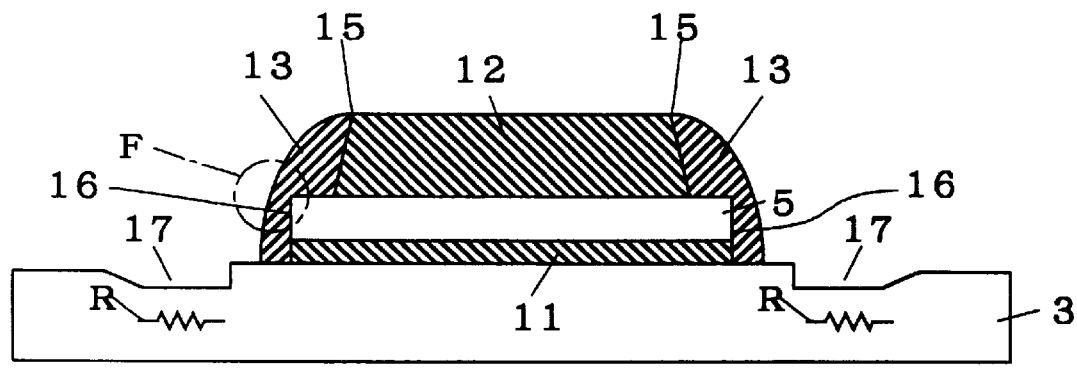
BACKGROUND ART FIG. 56
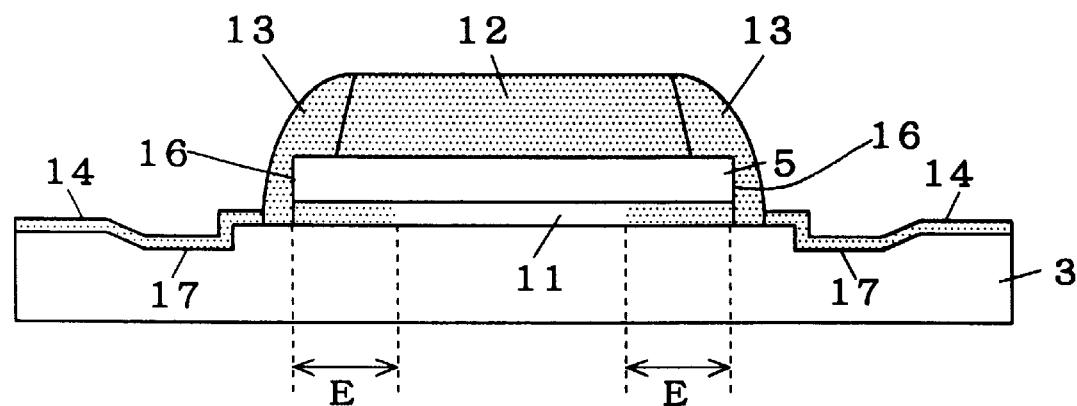
BACKGROUND ART FIG. 57
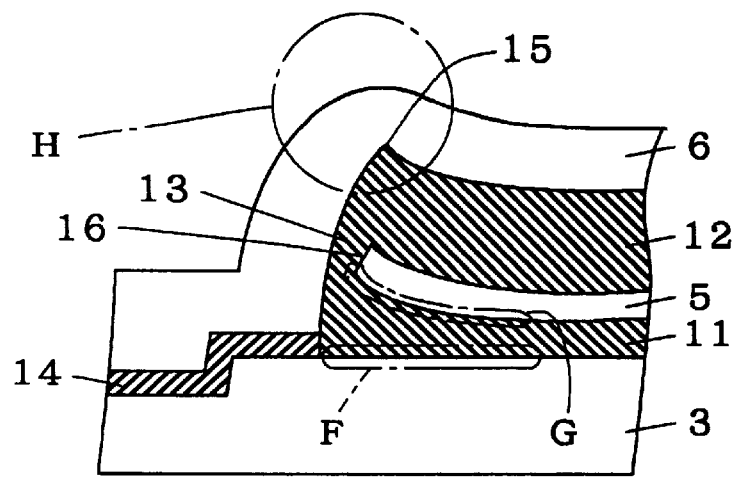

SEMICONDUCTOR DEVICE INCLUDING UPPER, LOWER AND SIDE OXIDATION-RESISTANT FILMS

BACKGROUND OF THE INVENTION

1. Field of the Invention

The present invention relates to a semiconductor device which is suitable to a field shield isolation structure and has such a structure that electrodes opposed to a semiconductor layer are insulated from each other by an insulating layer, and a method of fabricating the same, and more particularly, it relates to an improvement for preventing or relieving deterioration of characteristics and reliability of the device resulting from the insulating layer.

2. Description of the Background Art

FIG. 49 is a sectional perspective view showing the sectional structure of a conventional semiconductor device having a field shield isolation structure, which forms the background of the present invention. This semiconductor device is structured as that having a semiconductor to be provided with transistor elements or the like which is formed as a film on an insulating substrate, i.e., an SOI (semiconductor-on-isolation) semiconductor device.

As shown in FIG. 49, a buried oxide film 2 is formed on a support substrate 1, and a semiconductor layer is formed on this buried oxide film 2 as an SOI layer 3 in this semiconductor device 151. This SOI layer 3 includes a number of areas (NMOS areas) of NMOS transistor elements and a number of areas (PMOS areas) of PMOS transistor elements. In order to electrically isolate the plurality of element areas from each other, flat plate type FS electrodes (field shielding electrodes) 5 are formed to be opposed to isolation areas which are set between the respective element areas in the SOI layer 3.

Each element area of the SOI layer 3 is connected with drain and source electrodes, i.e., main electrodes, through a contact hole 7 which is provided in an insulating layer (not shown), and with a body contact electrode through another contact hole 9. A gate electrode 6 is opposed to each element area, while a gate wire is connected with this gate electrode 6 through still another contact hole 8.

Each FS electrode 5 is covered with an FS insulating layer (field shielding insulating layer) 4 which is made of an oxide. The FS insulating layer 4 electrically insulates the FS electrode 5 and the gate electrode 6 from each other.

In this device 151, a reverse bias voltage is applied to each FS electrode 5 for cutting off the SOI layer 3 of the isolation area, thereby implementing electrical isolation between the element areas. As another structure for implementing such isolation between element areas, a LOCOS structure of implementing isolation by selectively oxidizing the SOI layer 3, or a mesa isolation structure of selectively etching the SOI layer 3 thereby isolating the element areas from each other is widely known.

In the LOCOS structure or the mesa isolation structure, however, stress concentrates to a local portion the SOI layer 3, due to local oxidation or local etching of the SOI layer 3. This results in a problem in reliability of the device such as generation of a leakage current. In the device 151, on the other hand, neither local oxidation nor etching is necessary due to the employment of the field shield isolation structure, whereby stress concentration can be avoided and relatively high reliability can be advantageously attained while suppressing a leakage current.

In the conventional field shield isolation structure, however, various problems in reliability resulting from the structure and the method of fabricating the same are still unsolved. FIG. 50 is a front sectional view showing a part of a rectangular frame A appearing in FIG. 49 in an enlarged manner, for clearly illustrating these problems. Circular frames B, C and D shown in FIG. 50 illustrate parts related to these problems.

As shown in FIG. 50, the FS insulating layer 4 has an upper insulating layer 12 covering an upper part of the FS electrode 5, and a side wall (side wall part) 13 covering each edge portion 16 of the FS electrode 5. On the other hand, a lower insulating layer 11 is interposed between a major surface of the SOI layer 3 and the flat plate type FS electrode 5 opposed thereto, for electrically insulating the same from each other. Gate insulating films 14 are further formed on the major surface of the SOI layer 3. The gate insulating films 14 are made of an oxide, similarly to the FS insulating layer 4.

The gate electrode 6 is formed to be along surfaces of one gate insulating film 14, the side wall 13 and the upper insulating layer 12. Namely, the gate electrode 6 holds the gate insulating film 14, to be opposed to the major surface of the SOI layer 3 while maintaining electric insulation. The upper insulating layer 12 and the side wall 13 maintain electric insulation between the FS electrode 5 and the gate electrode 6.

FIGS. 51 to 55 are step diagrams showing fabrication steps causing a first problem shown by the circular frame B in FIG. 50. In a conventional method of fabricating the device 151, a composite obtained by successively forming the buried oxide film 2 and the SOI layer 3 on one major surface of the support substrate 1 is first prepared, as shown in FIG. 51. Then, an oxide film 21, a polysilicon layer 22 doped with an impurity, and an oxide layer 23 are formed in this order on a surface of the SOI layer 3 of this composite. Thereafter a patterned resist layer 24 is formed on the oxide layer 23.

Then, dry etching is performed through the resist layer 24 serving as a screen (mask), thereby selectively removing the oxide layer 23 and forming the upper insulating layer 12, as shown in FIG. 52. If wet etching is performed in place of the dry etching, side wall surfaces of the upper insulating layer 12 are retreated toward the interior of the resist layer 24 in the form of concave curved surfaces, as shown by numeral 26 in FIG. 52. This brings unpreferable results in the performance of the insulation and isolation between the FS electrode 5 and the gate electrode 6. Therefore, the dry etching is selected as the method of forming the upper insulating layer 12.

In this step, deposition films 25 are formed on surfaces of side portions of the upper insulating layer 12 as byproducts. The deposition films 25 are formed by adsorption of an etchant such as $CF_4$, for example, employed for the dry etching. A major surface of the oxide layer 23 is continually etched by accelerated $CF_4$ or the like in the process of the dry etching, whereby no such byproduct remains on the surface of the polysilicon layer 22. On hardly etched side walls of the upper insulating layer 12, however, the etchant remains as the deposition films 25.

Then, dry etching is further performed through the resist layer 24 serving as a screen, thereby selectively removing the polysilicon layer 22 and the oxide film 21, as shown in FIG. 53. At this time, the etching is performed while maintaining the deposition films 25 unremoved along with the resist layer 24. Consequently, the FS electrode 5 is formed from the polysilicon layer 22, while the lower insulating layer 11 is formed from the oxide film 21.

Thereafter the resist layer 24 and the deposition films 25 are removed, as shown in FIG. 54. Then, the side walls 13 are prepared from the same material as the lower and upper insulating layers 11 and 12, to cover the side wall surfaces of the upper insulating layer 12 and edge portions 16 of the FS electrode 5, as shown in FIG. 55. Thereafter the gate insulating films 14 are formed on the major surface of the SOI layer 3, and the gate electrode 6 is formed on one gate insulating film 14 and the FS insulating layer 4, as shown in FIG. 50.

The device 151 is fabricated through the aforementioned steps, and hence the edge portions 16 of the FS electrode 5 project outward beyond the side wall surfaces of the upper insulating layer 12, as shown in FIG. 55. In other words, top portions 15 of the side walls 13 are inwardly retreated from the edge portions 16 of the FS electrode 5. As shown in a circular frame F in FIG. 55, therefore, the thickness of each side wall 13 covering each edge portion 16 cannot be sufficiently ensured.

This means that the distance between one edge portion 16 and the gate electrode 6 is not sufficiently ensured, as shown in the circular frame B in FIG. 50. Consequently, the electrostatic capacitance between the FS electrode 5 and the gate electrode 6 is unnecessarily increased, to hinder a high-speed operation of the device. This also brings such a problem that a short readily takes place across the FS electrode 5 and the gate electrode 6.

While treatment employing HF (hydrofluoric acid) is performed before forming the gate insulating films 14 in order to clean the surface of the SOI layer 3 and to remove a natural oxide film, the thickness of each side wall 13 is further reduced by this HF treatment. Consequently, the margin with respect to the distance between the FS electrode 5 and the gate electrode 6 is further disadvantageously reduced.

A second problem shown by the circular frame C in FIG. 50 is now described. As shown in FIGS. 50 or 55, portions of the major surface of the SOI layer 3 in proximity to the side walls 13 are selectively scraped off in the etching step for forming the side walls 13, whereby depressed portions 17 are defined in these portions. This phenomenon is caused by concentration of plasma, which is employed for the etching, in the vicinity of end portions of the FS insulating layer 4 including the side walls 13.

Each depressed portion 17 is so locally and heterogeneously defined that it is difficult to control a threshold voltage which is specific to the gate electrode 6 formed on an area including one depressed portion 17 at a prescribed level in excellent accuracy. Further, local thicknesses of the SOI layer 3 are reduced beyond a certain limit due to the depressed portions 17, and hence the body resistance of the SOI layer 3 is increased in portions of resistances R shown in FIG. 55. Thus, an effect of body fixing by the body contact electrodes may not be sufficiently attained.

Further, the surface of each side wall 13 is inwardly retreated due to the HF treatment performed before forming the gate insulating films 14, and hence a sharp step shown in the circular frame C in FIG. 50 is defined on the surface of the SOI layer 3. Consequently, a MOS transistor having a low threshold voltage is disadvantageously parasitically generated in the vicinity of this step. In addition, the gate electrode 6 which is formed on the surface of the SOI layer 3 is problematic in reliability, since the SOI layer 3 is exposed to the dry etching.

A third problem shown in the circular frame D in FIG. 50 is now described. FIGS. 56 to 58 are step diagrams showing fabrication steps causing this problem. As shown in FIG. 56, an oxidant infiltrates into areas shown in a grained manner in FIG. 56, i.e., the upper insulating layer 12, the side walls 13, and portions of the lower insulating layer 11 close to the edge portions 16 of the FS electrode 5, following oxidation for forming the gate insulating films 14 on the major surface of the SOI layer 3.

The infiltration depth E of the oxidant in the lower insulating layer 11 measured from each edge portion 16 is about 0.5 μm in wet oxidation at 800° C., which is a typical oxidation condition. Consequently, portions exposed to the oxidant are oxidized in the surfaces of the FS electrode 5 and the SOI layer 3.

FIG. 57 is an enlarged sectional view showing a portion around one edge portion 16. As shown by symbols F and G in FIG. 57, oxidation progresses also in the upper major surface of the SOI layer 3 and the lower major surface of the FS electrode 5 which are opposed to each other through the lower insulating layer 11 over the range from the edge portion 16 substantially to the infiltration depth E, due to the oxidant infiltrating into the lower insulating layer 11. In particular, the lower major surface of the FS electrode 5 is remarkably oxidized as shown by symbol G, since the FS electrode 5 is made of polysilicon containing an impurity in high concentration.

Consequently, the FS electrode 5 is so arcuately bent in the vicinity of the edge portion 16 as to upwardly direct the edge portion 16, as exaggeratedly shown in FIG. 57. Therefore, the distance between the FS electrode 5 and the gate electrode 6 is disadvantageously narrowed. This further aggravates the first problem. Namely, the electrostatic capacitance between the FS electrode 5 and the gate electrode 6 is so increased that the operating speed of the device 151 is reduced and the isolatability between these electrodes is reduced. Further, a short readily takes place across these electrodes.

In addition, the top portion 15 of each side wall 13 upwardly projects as shown in the circular frame H as a result of bending of the FS electrode 5, and hence the step of the side wall 13 is enlarged. This increases the plasma reflected to each side wall surface of the gate electrode 6 as shown by symbol a in the step of forming the gate electrode 6 by selective dry etching, as shown in FIG. 58. Consequently, the gate electrode 6 is disadvantageously partially narrowed. When the gate electrode 6 is partially narrowed, punch-through resistance is weakened.

In the conventional device 151, as hereinabove described, problems in the characteristics of the device such as the operating speed, reliability in the gate electrode 6 and the like remain unsolved, due to the structure of the FS insulating layer 4 for electrically insulating the FS electrode 5 and the gate electrode 6 from each other and the fabrication method.

SUMMARY OF THE INVENTION

According to a first aspect of the present invention, a semiconductor device includes first and second electrodes which are opposed to a major surface of a semiconductor layer through first and second oxide insulating films respectively, and the first and second electrodes are electrically insulated from each other through an oxide insulating layer which is formed to cover the second electrode, while the second electrode includes a flat plate type conductor having a lower major surface which is opposed to the major surface of the semiconductor layer and an upper major surface opposite thereto, and upper and lower protective films which are oxidation-resistant films formed to cover the upper and lower major surfaces of the conductor respectively.

According to a second aspect of the present invention, the second electrode further includes a side protective film which is an oxidation-resistant film formed to cover a side wall surface of the conductor.

According to a third aspect of the present invention, the side protective film is extended toward the major surface of the semiconductor layer.

According to a fourth aspect of the present invention, a semiconductor device includes first and second electrodes which are opposed to a major surface of a semiconductor layer through first and second oxide insulating films respectively, and the first and second electrodes are electrically insulated from each other through an oxide insulating layer which is formed to cover the second electrode, while the second electrode includes a flat plate type conductor having a lower major surface which is opposed to the major surface of the semiconductor layer and an upper major surface which is opposite thereto, and upper and side protective films which are oxidation-resistant films formed to cover the upper major surface and a side wall surface of the conductor respectively, and the side protective film is extended toward the major surface of the semiconductor layer.

According to a fifth aspect of the present invention, the side protective film is extended upwardly beyond the upper major surface in the oxide insulating layer.

According to a sixth aspect of the present invention, the major surface of the semiconductor layer is formed as a retreated surface which is retreated from the remaining portions by sacrificial oxidation in a region provided with the first oxide insulating film.

According to a seventh aspect of the present invention, a semiconductor device includes first and second electrodes which are opposed to a major surface of a semiconductor layer through first and second oxide insulating films respectively, and the first and second electrodes are electrically insulated from each other through an oxide insulating layer which is formed to cover the second electrode, while a surface of a side wall part of the oxide insulating layer has a concave curved surface shape in a portion which is connected with the major surface of the semiconductor layer, to be smoothly connected with the major surface.

According to an eighth aspect of the present invention, a method of fabricating a semiconductor device including first and second electrodes which are opposed to a major surface of a semiconductor layer through first and second oxide insulating films respectively so that the first and second electrodes are electrically insulated from each other through an oxide insulating layer which is formed to cover the second electrode includes steps of preparing the semiconductor layer, forming a film of an oxide for defining the second oxide insulating film on the major surface of the semiconductor layer, forming a layer of an electrode material on the film of the oxide, forming a layer of an oxide on the layer of the electrode material, forming a patterned resist layer on the layer of the oxide, selectively removing the layer of the oxide by executing dry etching through the resist layer serving as a screen, thereby preparing an upper insulating layer forming a part of the oxide insulating layer from the layer of the oxide, executing another dry etching after forming the upper insulating layer thereby removing the resist layer, executing wet etching after forming the upper insulating layer for removing a deposit adhering to a side wall surface of the upper insulating layer as a by-product of the dry etching, forming the second electrode by selectively removing the layer of the electrode material after removing the resist layer and the deposit, and forming a side wall part forming another part of the oxide insulating layer to cover the side wall surface of the upper insulating layer and that of the second electrode, while the step of forming the second electrode includes a step of executing etching through the upper insulating layer serving as a screen thereby selectively removing the layer of the electrode material.

According to a ninth aspect of the present invention, the step of forming the second electrode further includes a step of retreating a side wall surface of a remaining portion of the layer of the electrode material by executing isotropic etching after selectively removing the layer of the electrode material by the etching.

According to a tenth aspect of the present invention, a method of fabricating a semiconductor device including first and second electrodes which are opposed to a major surface of a semiconductor layer through first and second oxide insulating films respectively so that the first and second electrodes are electrically insulated from each other through an oxide which is formed to cover the second electrode method includes steps of preparing the semiconductor layer, forming a film of an oxide for defining the second oxide insulating film on the major surface of the semiconductor layer, forming a layer of an electrode material on the film of the oxide, and forming a layer of an oxide on the layer of the electrode material, while the step of forming the layer of the electrode material includes steps of forming an oxidation-resistant film on the film of the oxide as a lower protective film, forming a layer of a conductive material on the lower protective film, and forming an oxidation-resistant film on the layer of the conductive material as an upper protective film, and the fabrication method further includes steps of forming a patterned layered product by selectively removing at least a portion starting from the layer of the conductive material and ending at the layer of the oxide among the layers from the film of the oxide to the layer of the oxide which are successively formed on the major surface of the semiconductor layer, and forming a side wall part of the oxide insulating layer to cover a side wall surface of the layered product.

According to an eleventh aspect of the present invention, the method further includes steps of forming another oxidation-resistant film, before forming the side wall part, on an upper surface and the side wall surface of the layered product and an exposed surface which is not covered with the layered product, and selectively removing the other oxidation-resistant film by executing etching to thereby leave a portion of the other oxidation-resistant film at least on a side wall surface of the layer of the conductive material in the side wall surface of the layered product.

According to a twelfth aspect of the present invention, the step of forming the layered product is adapted to selectively remove the portion starting from the film of the oxide and ending at the layer of the oxide, and the step of selectively removing the other oxidation-resistant film is adapted to leave the other oxidation-resistant film also at least in a region under the layer of the conductive material in the side wall surface of the layered product.

According to a thirteenth aspect of the present invention, a method of fabricating a semiconductor device including first and second electrodes which are opposed to a major surface of a semiconductor layer through first and second oxide insulating films respectively so that the first and second electrodes are electrically insulated from each other through an oxide insulating layer which is formed to cover the second electrode includes steps of preparing the semiconductor layer, forming a film of an oxide for defining the second oxide insulating film on the major surface of the semiconductor layer, forming a layer of an electrode material on the film of the oxide, and forming a layer of an oxide on the layer of the electrode material, while the step of forming the layer of the electrode material includes steps of forming a layer of a conductive material on the film of the oxide, and forming an oxidation-resistant film on the layer of the conductive material as an upper protective film, and the fabrication method further includes steps of forming a patterned layered product by selectively removing a portion starting from the film of the oxide and ending at the layer of the oxide which are successively formed on the major surface of the semiconductor layer, forming another oxidation-resistant film on an upper surface and a side wall surface of the layered product and an exposed surface which is not covered with the layered product, selectively removing the other oxidation-resistant film by executing etching to thereby leave a portion of the other oxidation-resistant film at least on a part of the side wall surface of the layered product which includes a side wall surface of the layer of the conductive material and below the same, and forming a side wall part of the oxide insulating layer to cover the side wall surface of the layered product including the other oxidation-resistant film.

According to a fourteenth aspect of the present invention, the step of selectively removing the other oxidation-resistant film is adapted to leave the other oxidation-resistant film also in the range from the upper protective film up to a certain height within said oxide insulating layer, on the side wall surface of the layered product.

According to a fifteenth aspect of the present invention, the step of forming the side wall part is executed in advance of the step of selectively removing the other oxidation-resistant film, the step of forming the side wall part includes steps of depositing an oxide to cover the other oxidation-resistant film, and selectively removing the oxide by executing anisotropic dry etching, thereby forming the side wall part from the oxide, and wet etching is executed as the etching in the step of selectively removing the other oxidation-resistant film, thereby removing a portion of the other oxidation-resistant film which is exposed to the exterior of the side wall part.

According to a sixteenth aspect of the present invention, at least the film of the oxide is not selectively removed in the step of forming the layered product, and the step of forming the side wall part includes steps of depositing an oxide on an upper surface and the side wall surface of the layered product, and an exposed surface which is not covered with the layered product, and selectively removing the deposited oxide by executing anisotropic dry etching thereby forming the side wall part from the oxide while at the same time also removing the film of the oxide in a portion which is covered with neither the layered product nor the side wall part.

According to a seventeenth aspect of the present invention, the method further includes steps of forming a sacrificial oxide film on a region of the major surface of the semiconductor layer to be provided with the first oxide insulating film, removing the sacrificial oxide film by executing wet etching, forming the first oxide insulating film on the region defined by removing the sacrificial oxide film, and forming the first electrode on the first oxide insulating film.

According to an eighteenth aspect of the present invention, a method of fabricating a semiconductor device including first and second electrodes which are opposed to a major surface of a semiconductor layer through first and second oxide insulating films respectively so that the first and second electrodes are electrically insulated from each other through an oxide insulating layer which is formed to cover the second electrode includes steps of preparing the semiconductor layer, forming a film of an oxide for defining the second oxide insulating film on the major surface of the semiconductor layer, forming a layer of an electrode material on the film of the oxide, forming a layer of an oxide on the layer of the electrode material, forming a patterned layered product by selectively removing a portion starting from the layer of the electrode material and ending at the layer of the oxide among the layers from the film of the oxide to the layer of the oxide which are successively formed on the major surface of the semiconductor layer, and forming a side wall part of the oxide insulating layer to cover a side wall surface of the layered product, while the step of forming the side wall part includes steps of depositing an oxide on an upper surface and the side wall surface of the layered product and an exposed surface which is not covered with the layered product, first executing anisotropic dry etching and thereafter switching the etching to wet etching in a final stage before exposing the major surface of the semiconductor layer thereby selectively removing the deposited oxide for forming the side wall part from the oxide while also removing the film of the oxide in a portion which is covered with neither the layered product nor the side wall part.

According to a nineteenth aspect of the present invention, a method of fabricating a semiconductor device including first and second electrodes which are opposed to a major surface of a semiconductor layer through first and second oxide insulating films respectively so that the first and second electrodes are electrically insulated from each other through an oxide insulating layer which is formed to cover the second electrode includes steps of preparing the semiconductor layer, forming a film of an oxide for defining the second oxide insulating film on the major surface of the semiconductor layer, forming a layer of an electrode material on the film of the oxide, forming a layer of an oxide on the layer of the electrode material, forming a patterned layered product by selectively removing a portion starting from the layer of the electrode material and ending at the layer of the oxide among the layers from the film of the oxide to the layer of the oxide which are successively formed on the major surface of the semiconductor layer, and forming a side wall part of the oxide insulating layer to cover a side wall surface of the layered product, while the step of forming the side wall part includes steps of depositing an oxide on an upper surface and the side wall surface of the layered product and an exposed surface which is not covered with the layered product, and selectively removing the deposited oxide by executing anisotropic dry etching thereby forming the side wall part from the oxide while also removing the film of the oxide in a portion which is covered with neither the layered product nor the side wall part.

In the device according to the first aspect of the present invention, the upper and lower major surfaces of the conductor of the second electrode are covered with the oxidation-resistant protective films, whereby the conductor is inhibited from being oxidized by action of an oxidant following oxidation for forming the first oxide insulating film and deforming the second electrode. Thus, the distance between the first and second electrodes is ensured and the electrostatic capacitance therebetween is lowly suppressed, whereby the operating speed of the device, isolation between the first and second electrodes, and reliability of the device are improved.

In the device according to the second aspect of the present invention, the conductor, which is covered with the protective films also on its side wall surface, is hardly subjected to the action of the oxidant. Therefore, the operating speed, the isolation and the reliability are further improved.

In the device according to the third aspect of the present invention, the side protective film is extended toward the major surface of the semiconductor layer, whereby infiltration of the oxidant into the second oxide insulating layer is suppressed. Thus, deformation of the second electrode is further suppressed.

In the device according to the fourth aspect of the present invention, the upper major surface and the side wall surface of the conductor are covered with the protective films and the side protective film is extended toward the major surface of the semiconductor layer, whereby infiltration of the oxidant into the conductor and the second oxide insulating layer is suppressed. Thus, deformation of the second electrode following oxidation of the conductor is suppressed. Therefore, the distance between the first and second electrodes is ensured and the electrostatic capacitance therebetween is lowly suppressed, whereby the operating speed of the device, the isolation between the first and second electrodes, and the reliability of the device are improved.

In the device according to the fifth aspect of the present invention, the side protective film is extended toward a portion above the upper major surface of the conductor in the oxide insulating layer, whereby the side protective film can be readily formed and the fabrication cost is saved.

In the device according to the sixth aspect of the present invention, the major surface of the semiconductor layer is formed as a retreated surface retreated from the remaining portions by sacrificial oxidation in the area provided with the first oxide insulating film, whereby the characteristics and reliability of the first oxide insulating film are improved.

In the device according to the seventh aspect of the present invention, the surface of the side wall part of the oxide insulating layer is smoothly connected with the major surface of the semiconductor layer, whereby such a phenomenon that an electric field generated by the first electrode concentrates to the connected portion is relieved. Thus, a leakage current of the device is reduced.

In the fabrication method according to the eighth aspect of the present invention, the electrode material is selectively removed by executing etching through the upper insulating layer serving as a screen after removing the resist layer and the deposit, whereby the side wall surface of the second electrode can be prevented from projecting outward beyond that of the upper insulating layer. Thus, the distance between the first and second electrodes is ensured and the electrostatic capacitance therebetween is lowly suppressed, whereby the operating speed of the device, the isolation between the first and second electrodes, and the reliability of the device are improved.

In the fabrication method according to the ninth aspect of the present invention, the step of retreating the side wall surface of the electrode material for forming the second electrode is executed, whereby the distance between the first and second electrodes is further largely ensured.

In the fabrication method according to the tenth aspect of the present invention, the second electrode is so formed that the upper and lower major surfaces of the conductor are covered with the oxidation-resistant protective films, whereby the conductor is inhibited from being oxidized by action of the oxidant following oxidation for forming the first oxide insulating film and deforming the second electrode. Thus, the distance between the first and second electrodes is ensured and the electrostatic capacitance therebetween is lowly suppressed, whereby the operating speed of the fabricated device, the isolation between the first and second electrodes, and the reliability of the device are improved.

In the fabrication method according to the eleventh aspect of the present invention, the conductor, which is covered with the protective film also on its side wall surface, is further hardly exposed to the action of the oxidant. Thus, the operating speed of the fabricated device, the isolation and the reliability are further improved.

In the fabrication method according to the twelfth aspect of the present invention, the oxidation-resistant film remains at least in an area including the layer of the conductive material and below in the side wall surface of the layered product, whereby the oxidant is prevented from infiltrating into the area immediately under the second electrode serving as a second oxide insulating film in the film of the oxide following oxidation for forming the first oxide insulating film. Thus, deformation of the second electrode is further suppressed.

In the fabrication method according to the thirteenth aspect of the present invention, the second electrode is so formed that the upper major surface and the side wall surface of the conductor are covered with the oxidation-resistant protective films while the side protective film is formed to be extended toward the major surface of the semiconductor layer, whereby the oxidant is inhibited from infiltration into the conductor and the second oxide insulating film. Thus, deformation of the second electrode following oxidation of the conductor is suppressed. Therefore, the distance between the first and second electrodes is ensured and the electrostatic capacitance therebetween is lowly suppressed, whereby the operating speed of the device, the isolation between the first and second electrodes, and the reliability of the device are improved.

In the fabrication method according to the fourteenth aspect of the present invention, the oxidation-resistant film is so selectively removed that the same remains also in the range from the upper protective film up to a certain height in the layer of the oxide in the side wall surface of the layered product. Therefore, it is possible to readily leave the oxidation-resistant film to cover the side wall surface of the layer of the electrode material. Namely, this selective removing step is easy and the fabrication cost is saved.

In the fabrication method according to the fifteenth aspect of the present invention, the semiconductor layer is not exposed to etching other than wet etching except in case of removing the film of the oxide, whereby the amount of crystal defects introduced into the first oxide insulating film is lowly suppressed. Consequently, deterioration in characteristics and reliability of the first oxide insulating film is suppressed.

In the fabrication method according to the sixteenth aspect of the present invention, formation of the side wall part and removal of the film of the oxide are simultaneously performed by anisotropic dry etching, whereby the semiconductor layer is exposed to dry etching only once. Thus, the amount of crystal defects introduced into the first oxide insulating film is lowly suppressed. Consequently, deterioration in characteristics and reliability of the first oxide insulating film is suppressed.

In the fabrication method according to the seventeenth aspect of the present invention, formation of the sacrificial oxide film and removal thereof are performed in the area provided with the first oxide insulating film, whereby the amount of crystal defects introduced into the first oxide insulating film is further lowly suppressed.

In the fabrication method according to the eighteenth aspect of the present invention, the wet etching is executed in the final stage of the step of carrying out formation of the side wall part and removal of the film of the oxide, whereby the semiconductor layer is not exposed to etching other than the wet etching. Thus, the amount of crystal defects introduced into the first oxide insulating film is lowly suppressed, whereby deterioration in characteristics and reliability of the first oxide insulating film is suppressed. Further, the side wall surface of the film of the oxide is smoothly connected with the major surface of the semiconductor layer due to the wet etching, whereby such a phenomenon that an electric field generated by the first electrode concentrates to the connected portion is relieved. Thus, a leakage current of the device is reduced.

In the fabrication method according to the nineteenth aspect of the present invention, formation of the side wall part and removal of the film of the oxide are simultaneously performed by anisotropic dry etching, whereby the semiconductor layer is exposed to dry etching only once. Thus, the amount of crystal defects introduced into the first oxide insulating film is lowly suppressed. Consequently, deterioration in characteristics and reliability of the first oxide insulating film is suppressed.

Accordingly, an object of the present invention is to obtain a semiconductor device including a plurality of electrodes which are insulated from each other by an insulating layer and opposed to a semiconductor layer, which can prevent or relieve deterioration of characteristics and reliability of the device resulting from the insulating layer. Another object of the present invention is to provide a fabrication method suitable to fabrication of the semiconductor device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 52 illustrates a step of fabricating the conventional device;

FIG. 53 illustrates a step of fabricating the conventional device;

FIG. 54 illustrates a step of fabricating the conventional device;

FIG. 55 illustrates a step of fabricating the conventional device;

FIG. 56 illustrates a step of fabricating the conventional device;

FIG. 57 illustrates a step of fabricating the conventional device; and

DESCRIPTION OF THE PREFERRED EMBODIMENTS

<Embodiment 1>

Figure 1:
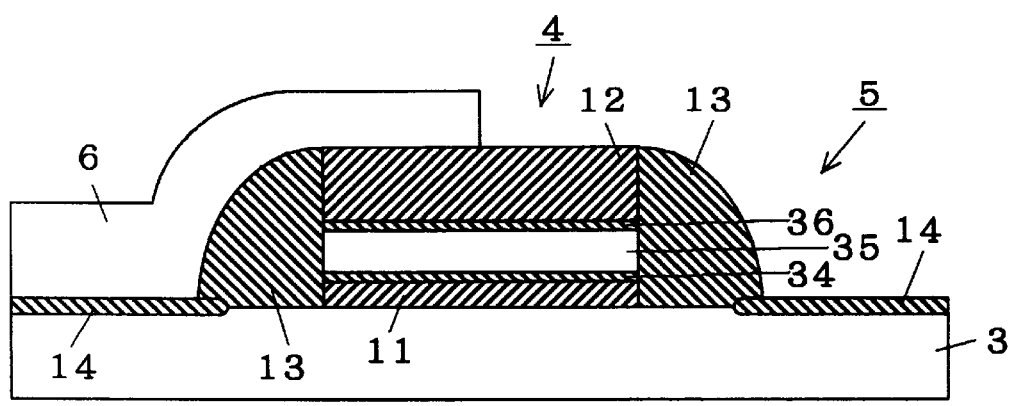
FIG. 1 is a sectional view showing a device according to an embodiment 3 of the present invention.

FIGS. 2 to 10 are step diagrams showing a fabrication method according to an embodiment 1 of the present invention. In the following figures, parts identical to those of the conventional device and the fabrication steps shown in FIGS. 49 to 58 are denoted by the same reference numerals, to omit redundant description. This embodiment is characteristically different from the conventional fabrication method in a point that a resist layer 24 and deposition films 25 are previously removed after forming an upper insulating layer 12, in advance of performing etching on a polysilicon layer 22 and an oxide film 21.

Figure 51:
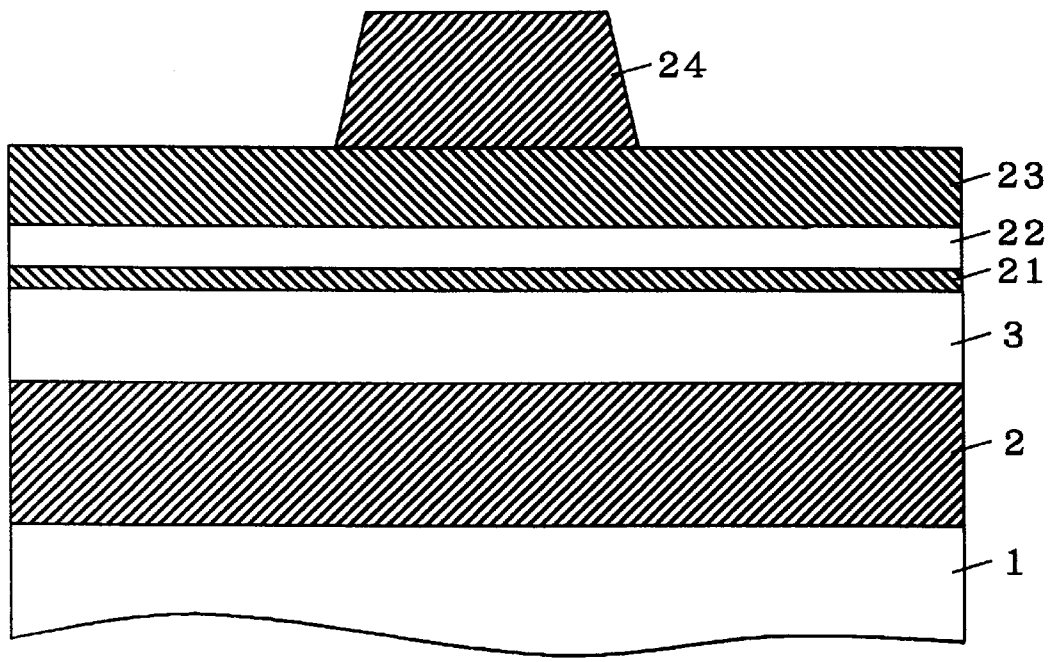
FIG. 51 illustrates a step of fabricating the conventional device.
Figure 58:
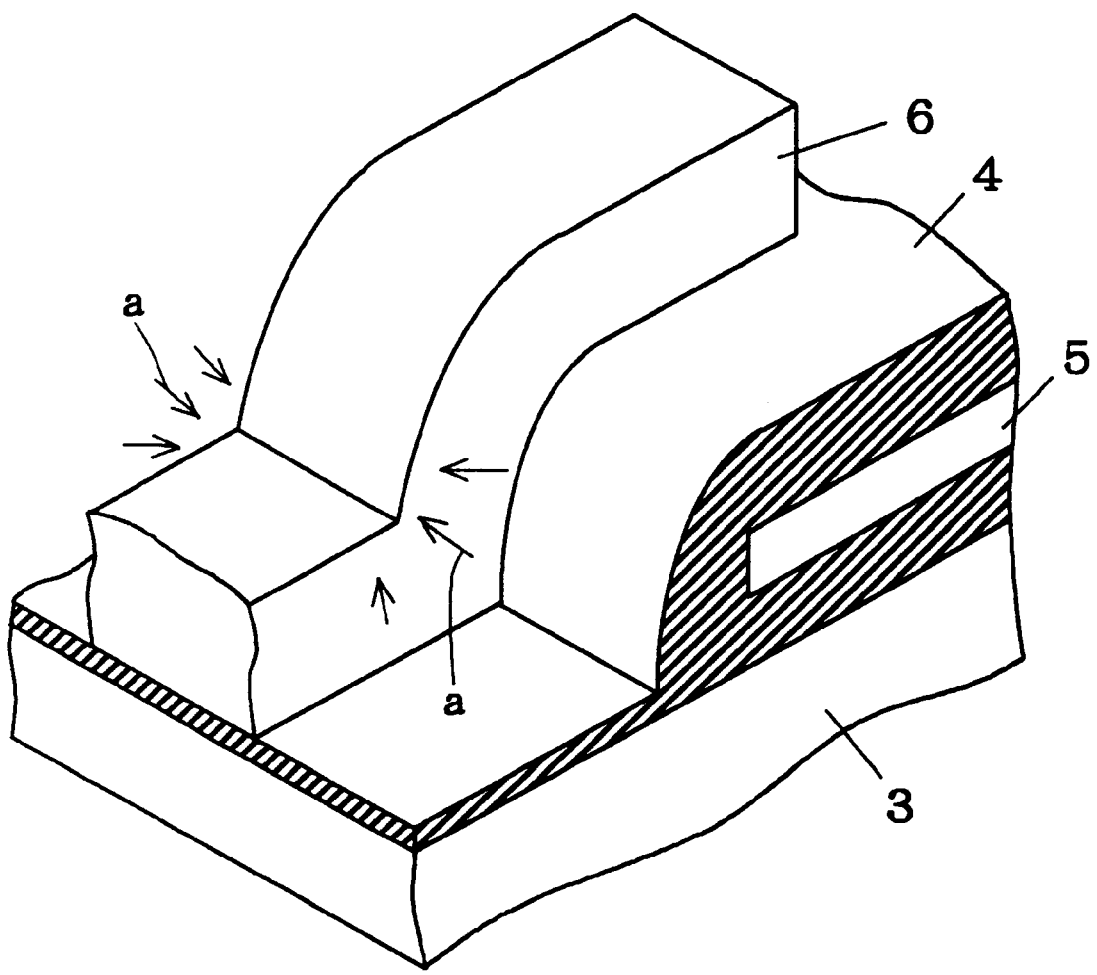
FIG. 58 illustrates a step of fabricating the conventional device.

In this fabrication method, the step of FIG. 51 is first executed. Namely, the oxide film 21, the polysilicon layer 22, an oxide layer 23, and a patterned resist layer 24 are successively formed on an SOI layer 3. The patterned resist layer 24 can be formed by employing a well-known technique of applying a material for the resist layer 24 along the overall surface of the oxide layer 23 and thereafter printing a prescribed pattern.

The oxide film 21, the polysilicon layer 22 and the oxide layer 23 are set at thicknesses of about 20 nm, 50 nm and 150 nm respectively, for example. The polysilicon layer 22 may be formed by simultaneously doping an impurity in the process of forming the polysilicon layer 22, or by doping an impurity by ion implantation after forming the polysilicon layer 22.

Then, the resist layer 24 is employed as a screen for executing dry etching, thereby forming the upper insulating layer 12 from the oxide layer 23, as shown in FIG. 52. For example, ordinary etching performed by adding CO to $CF_4$ gas is employable for this dry etching. As a result of the dry etching, the deposition films 25 are formed as byproducts to cover side wall surfaces of the upper insulating layer 12 in the step of FIG. 52, as described above.

Figure 2:
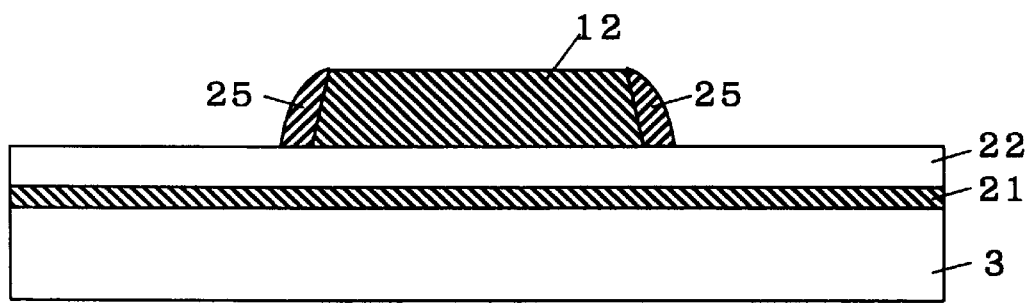
FIG. 2 illustrates a step of fabricating a device according to an embodiment 1 of the present invention.
Figure 3:
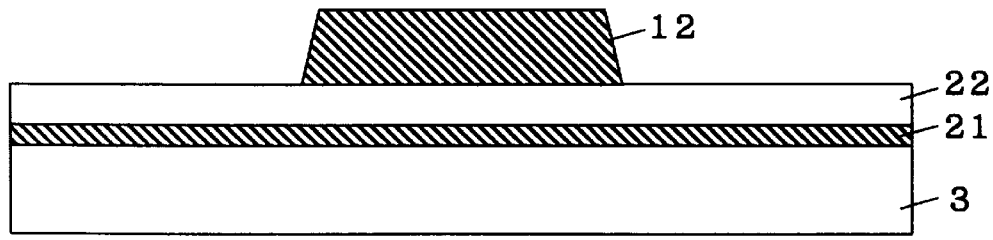
FIG. 3 illustrates a step of fabricating the device according to the embodiment 1 of the present invention.

Then, the resist layer 24 is removed as shown in FIG. 2, dissimilarly to the conventional method. The resist layer 24 is removed by generally known dry etching which is suitable to resist removal. In this treatment, the deposition films 25 are at least not sufficiently removed but remain. After the removal of the resist layer 24 is completed, therefore, wet etching employing $H_2SO_4$, for example, is executed thereby removing the deposition films 25, as shown in FIG. 3.

Figure 4:
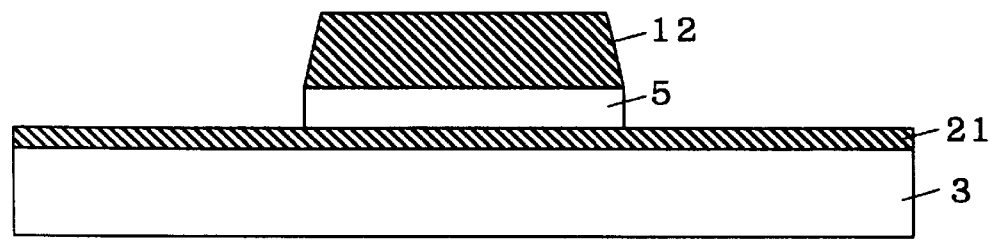
FIG. 4 illustrates a step of fabricating the device according to the embodiment 1 of the present invention.

Then, anisotropic dry etching is performed through the upper insulating layer 12 serving as a screen, thereby selectively removing the polysilicon layer 22, as shown in FIG. 4. For example, ordinary etching employing $Cl_2$ gas and HBr is employable for this dry etching. As a result of this step, an FS electrode 5 is formed from the polysilicon layer 22.

Figure 5:
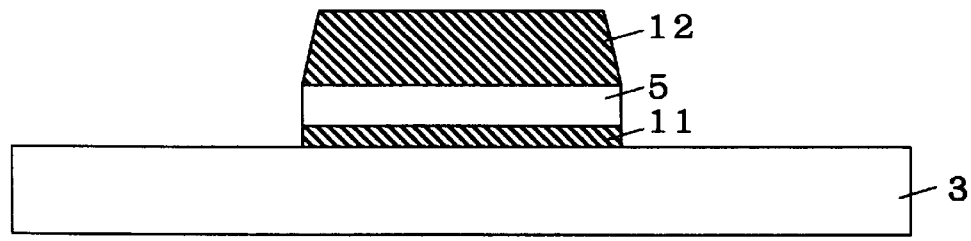
FIG. 5 illustrates a step of fabricating the device according to the embodiment 1 of the present invention.

Thereafter dry etching is performed through the upper insulating layer 12 (and the FS electrode 5) as a screen thereby selectively removing the oxide film 21, as shown in FIG. 5. For example, generally known etching which is performed by adding CO to $CF_4$ gas is employable for this etching. If the percentage of CO is high, the selection ratio between etching of the oxide film 21 and that of the SOI layer 3 is increased. Therefore, the percentage of CO is preferably set high, not to unnecessarily consume the SOI layer 3 which is thinly formed on a buried oxide film 2.

As a result of the step shown in FIG. 5, a lower insulating layer 11 is formed from the oxide film 21. The resist layer 24 and the deposition films 25 are removed in advance of formation of the FS electrode 5 and the lower insulating layer 11, whereby the FS electrode 5 is formed in a shape hardly projecting outward beyond the side wall surfaces of the upper insulating layer 12, as shown in FIG. 5. The etching performed on the oxide film 21 also acts on the upper insulating layer 12, to slightly reduce its thickness. In consideration of this thickness reduction, therefore, the thickness of the upper insulating layer 12, i.e., the thickness of the oxide layer 23, is preferably set at a somewhat large level.

Figure 6:
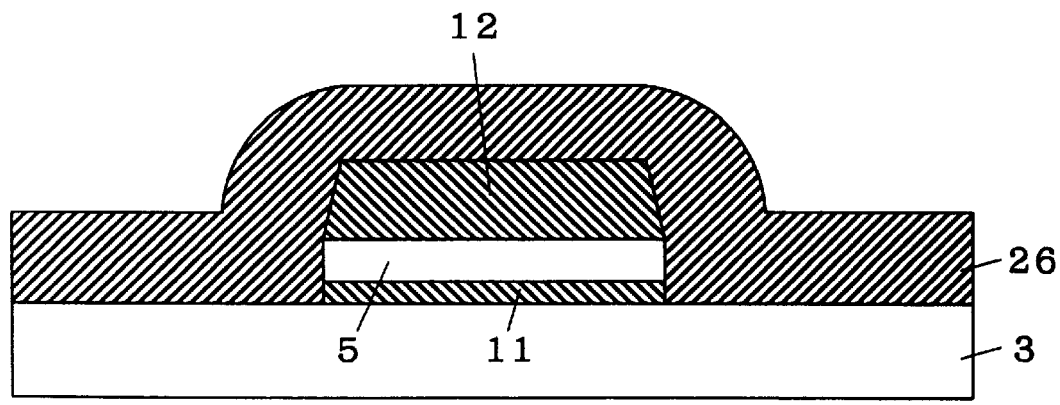
FIG. 6 illustrates a step of fabricating the device according to the embodiment 1 of the present invention.

Then, an oxide film 26 which is made of the same material as the upper insulating layer 12 or the lower insulating layer 11 is deposited along the overall surface of the device, as shown in FIG. 6. Its thickness is set at about 150 nm, for example.

Thereafter the oxide film 26 is etched back by anisotropic etching, thereby forming side walls 13 to cover the upper insulating layer 12, the FS electrode 5 and side wall surfaces of the lower insulating layer 11. The generally known etching which is performed by adding CO to $CF_4$ gas is also employable for this step. At this time, the percentage of CO is preferably set high, not to unnecessarily consume the SOI layer 3.

Figure 8:
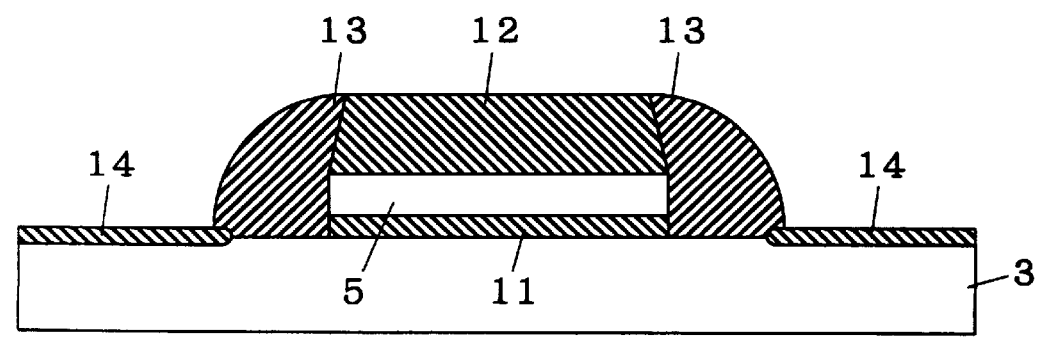
FIG. 8 illustrates a step of fabricating the device according to the embodiment 1 of the present invention.

Then, a surface of the SOI layer 3 is oxidized, for forming gate insulating films 14, as shown in FIG. 8. For example, ordinary wet oxidation which is performed at 800° C. is employed for this oxidation.

Figure 9:
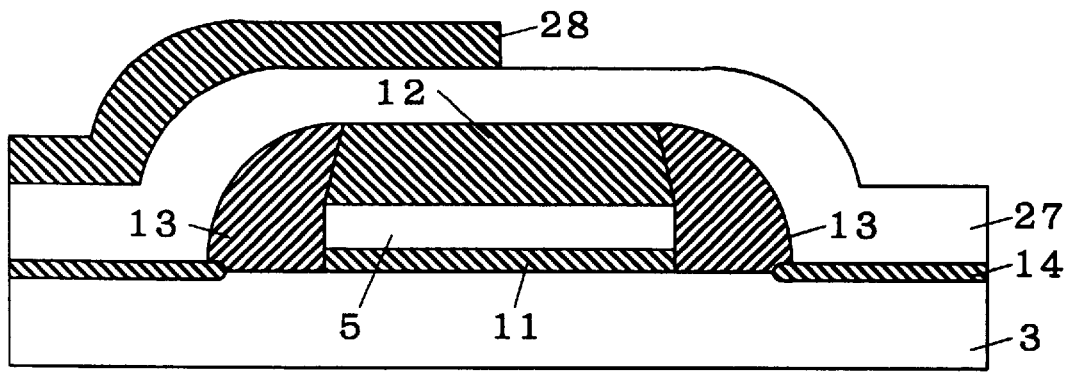
FIG. 9 illustrates a step of fabricating the device according to the embodiment 1 of the present invention.

Then, a polysilicon layer 27 which is doped with an impurity is deposited along the overall upper surface of the device, as shown in FIG. 9. Also in this step, impurity doping may be performed either simultaneously with or after deposition of the polysilicon layer 27, similarly to the step of forming the polysilicon layer 22. Thereafter a patterned resist layer 28 is formed on the polysilicon layer 27. The resist layer 28 can be formed through a step similar to that for forming the resist layer 24.

Then, dry etching is performed by employing the resist layer 28 as a screen, thereby selectively removing the polysilicon layer 27. Consequently, a gate electrode 6 is formed to extend over one gate insulating film 14 and an FS insulating layer 4, as shown in FIG. 10.

Figure 10:
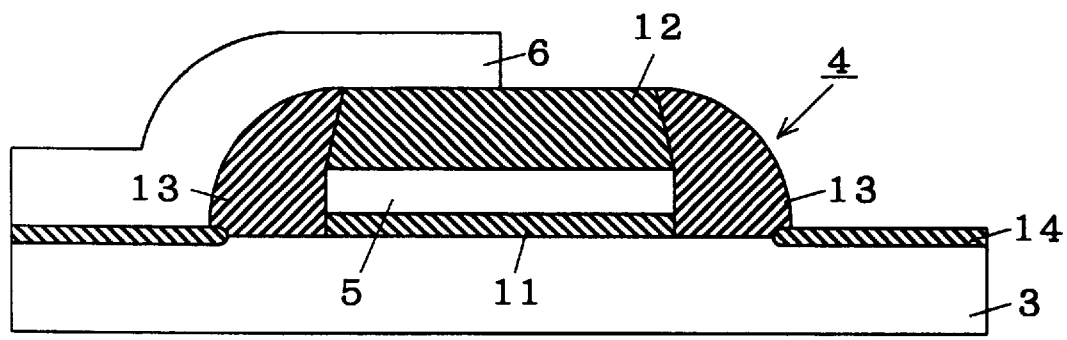
FIG. 10 illustrates a step of fabricating the device according to the embodiment 1 of the present invention.

In the fabrication method according to this embodiment, the FS electrode 5 hardly projects beyond the side wall surfaces of the upper insulating layer 12 as shown in FIG. 10, whereby the distance between the FS electrode 5 and the gate electrode 6 which is formed on one side wall 13 is sufficiently largely ensured. Consequently, the electrostatic capacitance between the FS electrode 5 and the gate electrode 6 is lowly suppressed, whereby a high-speed operation of the device is not hindered while isolation between these electrodes is excellent. Further, a short trouble hardly takes place between these electrodes, whereby the fabrication yield of the device is improved. Namely, problems in characteristics and reliability of the device resulting from the structure of the FS insulating layer 4 are solved or relieved.

<Embodiment 2>

Figure 11:
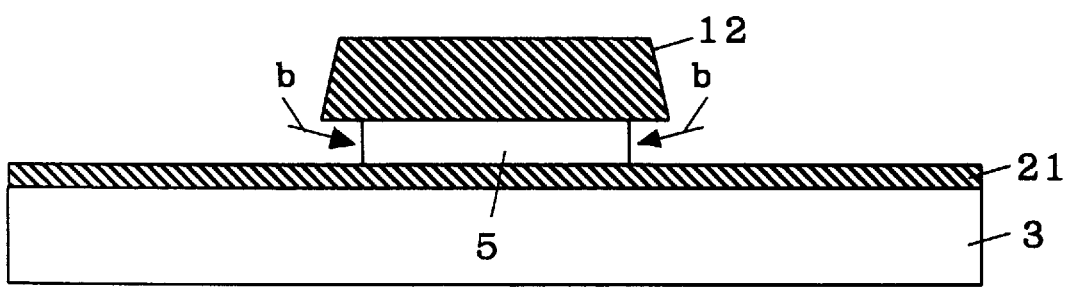
FIG. 11 illustrates a step of fabricating a device according to an embodiment 2 of the present invention.
Figure 12:
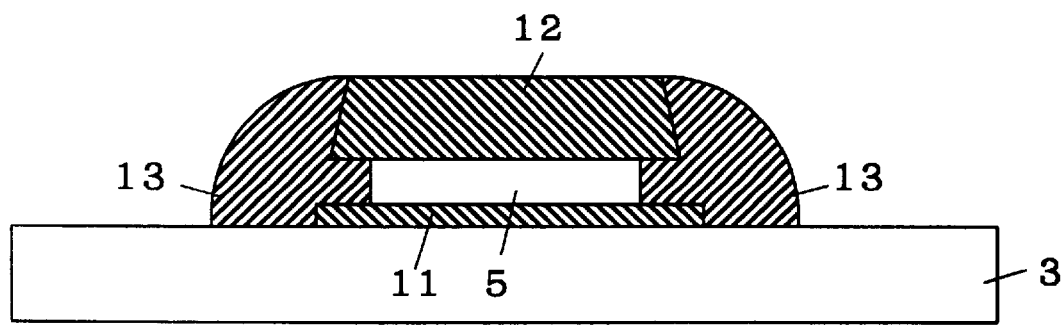
FIG. 12 illustrates a step of fabricating the device according to the embodiment 2 of the present invention.

FIGS. 11 and 12 are step diagrams showing a fabrication method according to an embodiment 2 of the present invention. According to this method, the steps up to FIG. 3 in the embodiment 1 are executed and thereafter a polysilicon layer 22 is subjected to isotropic etching until edge portions of an FS electrode 5 are inwardly retreated beyond side wall surfaces of an upper insulating layer 12, as shown in FIG. 11. Referring to FIG. 11, an etchant acts on the FS electrode 5 along arrows b. In place of directly shifting from the step of FIG. 3 to that of FIG. 11, the anisotropic etching step of FIG. 4 may be executed following the step of FIG. 3, so that the step of FIG. 11 is thereafter carried out.

For example, etching employing $F_2$ or that employing $CF_4$ and $O_2$ is preferably employed as the isotropic etching shown in FIG. 11. In the former case, reaction of polysilicon readily progresses while residues hardly adhere to the side walls. In the latter case, on the other hand, residues reacting with oxygen are removed as $CO_2$, to hardly remain.

Thereafter steps similar to those of FIGS. 5 and 6 are executed, thereby forming side walls 13 as shown in FIG. 12. Grooves defined between the upper insulating layer 12 and a lower insulating layer 11 through the retreated edge portions of the FS electrode 5 can be filled up with an oxide film 26 (the side walls 13) with excellent coverage, by executing the step of depositing the oxide film 26 shown in FIG. 6 by CVD, for example. Thereafter steps similar to those of FIGS. 8 to 10 are executed, thereby forming a gate electrode 6 to extend over one gate insulating film 14 and an FS insulating layer 4.

In the fabrication method according to this embodiment, the FS electrode 5 is inwardly retreated beyond the side wall surfaces of the upper insulating layer 12 as shown in FIG. 12, whereby the distance between the FS electrode 5 and the gate electrode 6 which is formed on one side wall 13 is further largely ensured. Consequently, the electrostatic capacitance between the FS electrode 5 and the gate electrode 6 is further lowly suppressed. Therefore, the operating speed of the device, isolation, reliability and the yield are further improved.

<Embodiment 3>

FIGS. 13 to 16 and FIG. 1 are step diagrams showing a fabrication method according to an embodiment 3. The method of this embodiment is characteristically different from that of the embodiment 1 in a point that nitride films are formed on upper and lower surfaces of an FS electrode 5.

Figure 13:
FIG. 13 illustrates a step of fabricating the device according to the embodiment 3 of the present invention.

According to this fabrication method, a composite having a support substrate 1, a buried oxide film 2 and an SOI layer 3 similarly to that of FIG. 51 is first prepared, and an oxide film 21, a nitride film (SiN film) 31, a polysilicon layer 32, another nitride film (SiN film) 33 and an oxide layer 23 are thereafter successively formed on the SOI layer 3 in this order, as shown in FIG. 13. The nitride films 31 and 33 are deposited in thicknesses of about 10 nm by CVD, for example.

Figure 14:
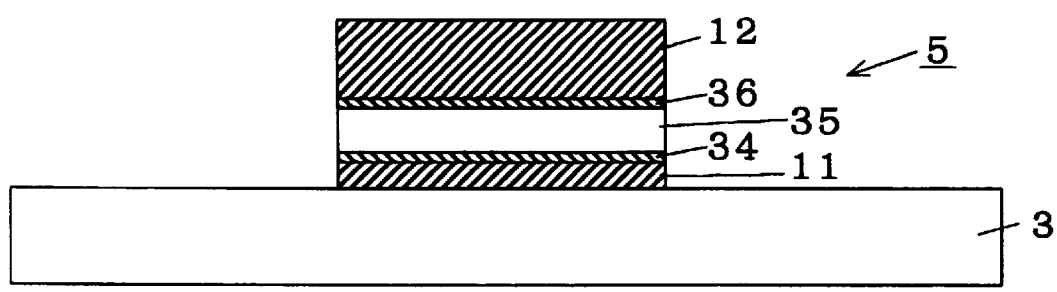
FIG. 14 illustrates a step of fabricating the device according to the embodiment 3 of the present invention.

Then, steps similar to those of FIGS. 2 to 5 are executed, thereby obtaining such a structure that the FS electrode 5 is held between a lower insulating layer 11 and an upper insulating layer 12, as shown in FIG. 14. Further, nitride films 36 and 34 are respectively formed on upper and lower major surfaces of a flat plate type polysilicon layer 35 which is a principal part of the FS electrode 5. The polysilicon layer 32 and the nitride films 31 and 33 may be simultaneously removed by etching in the step corresponding to FIG. 4 among these steps.

For example, etching employing gas such as $Cl_2$, $CF_4$ or HBr is effective for this treatment. In this method, the selection ratio between polysilicon and SiN is not large. Therefore, this method is suitable for simultaneously etching the polysilicon layer 32 and the nitride films 31 and 33.

Figure 7:
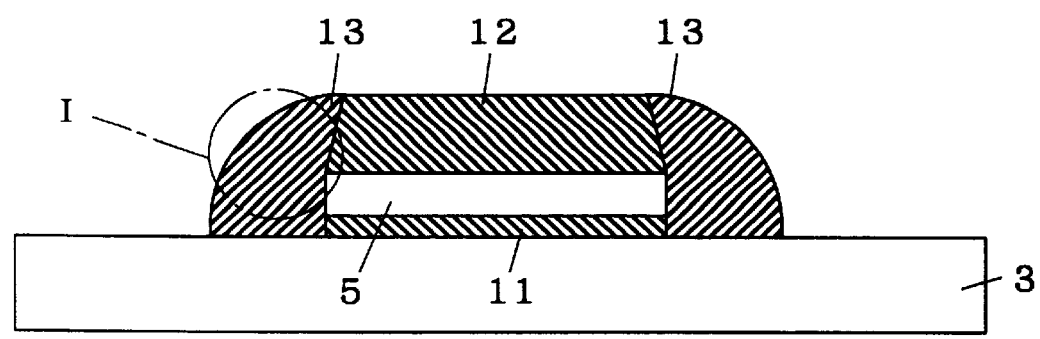
FIG. 7 illustrates a step of fabricating the device according to the embodiment 1 of the present invention.
Figure 15:
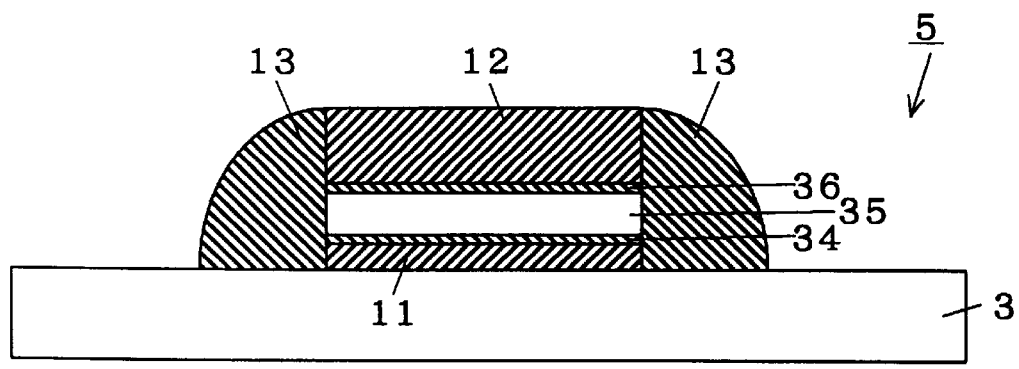
FIG. 15 illustrates a step of fabricating the device according to the embodiment 3 of the present invention.
Figure 16:
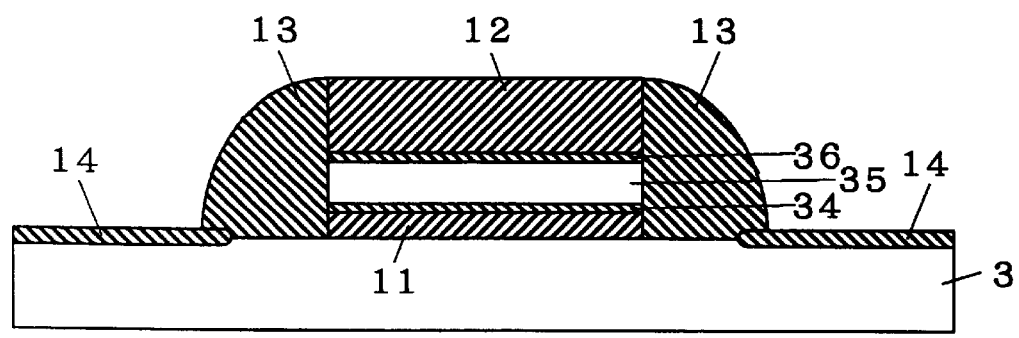
FIG. 16 illustrates a step of fabricating the device according to the embodiment 3 of the present invention.

Then, steps similar to those of FIGS. 6 and 7 are executed, thereby forming side walls 13 as shown in FIG. 15. Thereafter a step similar to that of FIG. 8 is executed, thereby forming gate insulating films 14 on a surface of the SOI layer 3 as shown in FIG. 16. At this time, both major surfaces of the polysilicon layer 35 are covered with the nitride films 34 and 36, whereby the polysilicon layer 35 is prevented from being oxidized by an oxidant, except its side end surfaces.

Therefore, edge portions 16 of the FS electrode 5 are hardly bent, dissimilarly to those shown in FIG. 57. While the upper surface of the SOI layer 3 is influenced by the oxidant as shown by symbol F in FIG. 57, the degree of oxidation in the SOI layer 3 is by far lower as compared with the FS electrode 5 provided with no nitride films 34 and 36 as described above, whereby the influence is small.

Thereafter steps similar to those of FIGS. 9 and 10 are executed, whereby a gate electrode 6 is formed on one gate insulating film 14 and the FS insulating layer 4, as shown in FIG. 1.

According to the method of this embodiment, as hereinabove described, bending of the FS electrode 5 is so suppressed that the distance between the FS electrode 5 and the gate electrode 6 formed on one side wall 13 is largely ensured. Consequently, the electrostatic capacitance between the FS electrode 5 and the gate electrode 6 is lowly suppressed, whereby the operating speed of the device, isolation, reliability and the yield are improved.

It is possible to obtain such a structure that the edge portions of the FS electrode 5 which is formed by the polysilicon layer 35 held between the nitride films 34 and 36 are retreated from the side wall surfaces of the upper and lower insulating layers 12 and 11 as shown in FIG. 12, by replacing the step of FIG. 4 with that of FIG. 11. In this case, the distance between the FS electrode 5 and the gate electrode 6 is further largely ensured.

<Embodiment 4>

In the method of the embodiment 3, bending of the FS electrode 5 is prevented by the nitride films 34 and 36. Therefore, the surface of the SOI layer 3 can be sacrificially oxidized. FIGS. 17 to 20 are step diagrams showing an example of such a fabrication method.

The SOI layer 3 is exposed to the etchant for the dry etching in both of the step of FIG. 14 for removing the oxide film 21 by etching and that of FIG. 15 for forming the side walls 13 by etching the oxide film 26. When gate insulating films 14 are thereafter formed on the surface of the SOI layer 3 as shown in FIG. 16, crystal defects caused in the SOI layer 3 in the process of the dry etching are also incorporated in the gate insulating films 14, to reduce the characteristics and reliability thereof.

Figure 17:
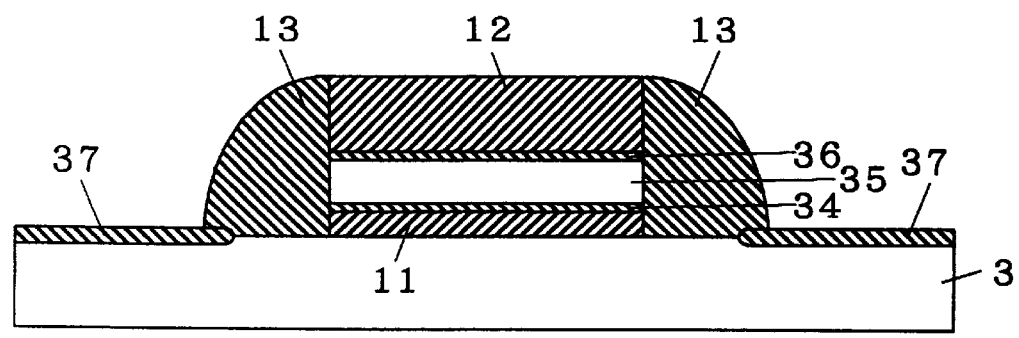
FIG. 17 illustrates a step of fabricating a device according to an embodiment 4 of the present invention.

In order to prevent this deterioration, sacrificial oxide films 37 are formed on the surface of the SOI layer 3 as shown in FIG. 17, after the step of FIG. 15. The sacrificial oxide films 37 are formed by performing wet oxidation at 800° C., for example, on the surface of the SOI layer 3, similarly to the step of forming the gate insulating films 14.

Figure 18:
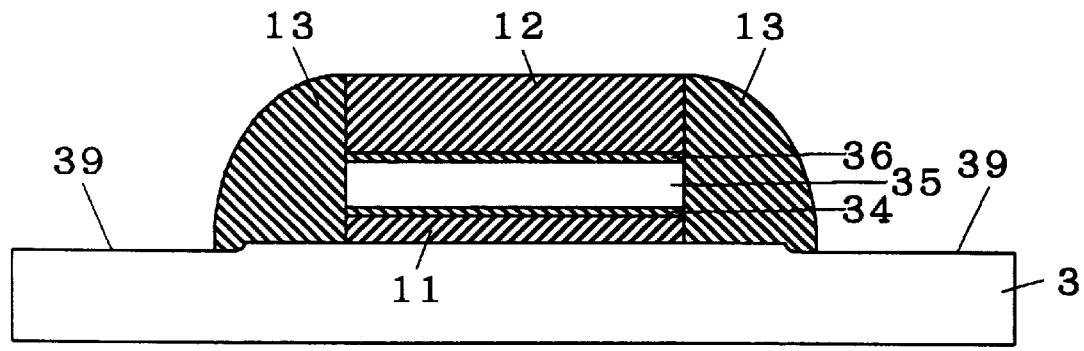
FIG. 18 illustrates a step of fabricating the device according to the embodiment 4 of the present invention.
Figure 19:
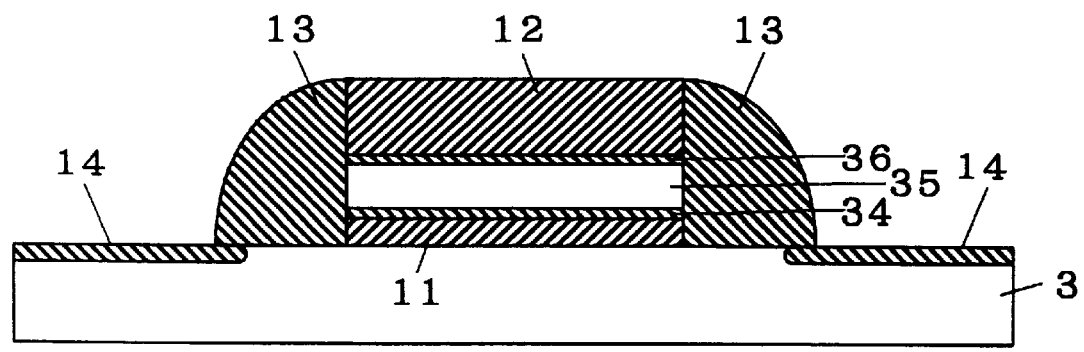
FIG. 19 illustrates a step of fabricating the device according to the embodiment 4 of the present invention.

Thereafter the sacrificial oxide films 37 are removed by wet etching, as shown in FIG. 18. Consequently, retreated surfaces 39 are formed on the major surface of the SOI layer 3. Thus, crystal defects introduced into the SOI layer 3 by the dry etching are removed along with the sacrificial oxide films 37. Thereafter gate insulating films 14 are formed on the surface of the SOI layer 3 anew, as shown in FIG. 19. The crystal defects are already removed along with the sacrificial oxide films 37, whereby introduction of crystal defects into the gate insulating films 14 is inhibited, and deterioration in characteristics and reliability of the gate insulating films 14 is suppressed.

Figure 50:
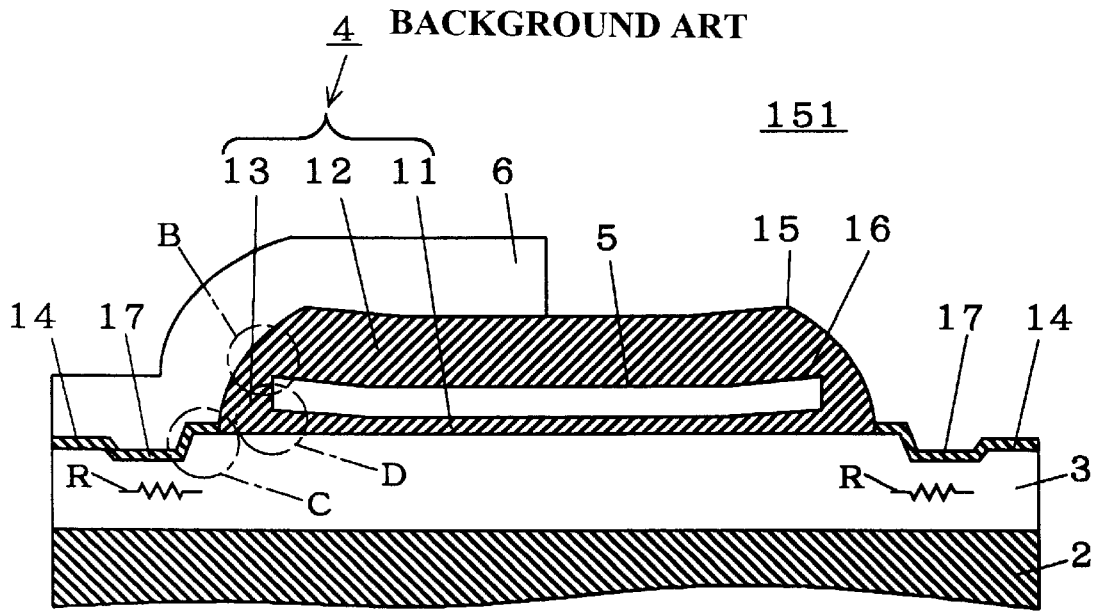
FIG. 50 is a sectional view of the conventional device.

As a result of removal of the sacrificial oxide films 37, further, the SOI layer 3 is uniformly reduced in thickness on the retreated surfaces 39. Thus, the depressed portions 17 shown in FIG. 50 disappear, and the problem resulting from the depressed portions 17 is solved. In addition, a substrate bias effect caused by body contact can be reduced, whereby a threshold voltage in the gate electrode 6 is reduced so that the device can be driven at a low voltage. The SOI layer 3 is reduced in thickness by oxidation, whereby the thickness uniformity is so excellent that the threshold voltage can be controlled at a prescribed level in excellent accuracy, dissimilarly to the prior art having the depressed portions 17 (FIG. 50).

Figure 20:
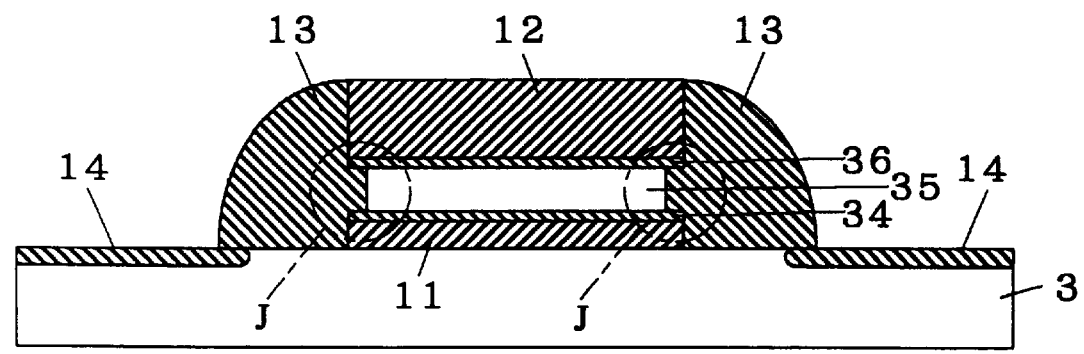
FIG. 20 illustrates a step of fabricating the device according to the embodiment 4 of the present invention.

Further, oxidation is performed twice for forming the sacrificial oxide films 37 and the gate insulating films 14 respectively, whereby side wall surfaces of edge portions of the polysilicon layer 35 are oxidized and somewhat inwardly retreated as shown in circular frames J in FIG. 20. Thus, the distance between the FS electrode 5 and the gate electrode 6 is further enlarged. Consequently, the electrostatic capacitance between the FS electrode 5 and the gate electrode 6 is further lowly suppressed, while a short trouble hardly takes place.

<Embodiment 5>

Figure 21:
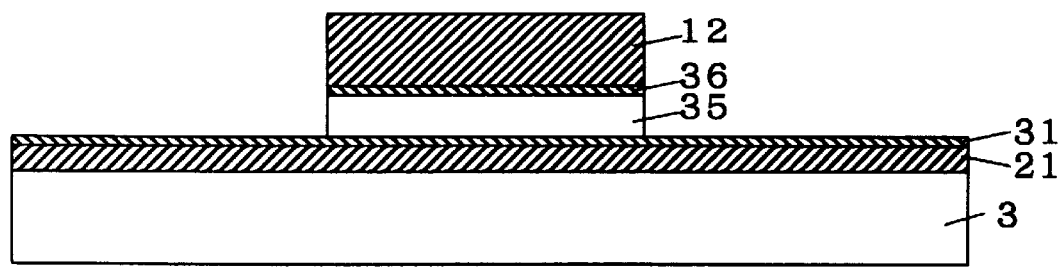
FIG. 21 illustrates a step of fabricating a device according to an embodiment 5 of the present invention.
Figure 22:
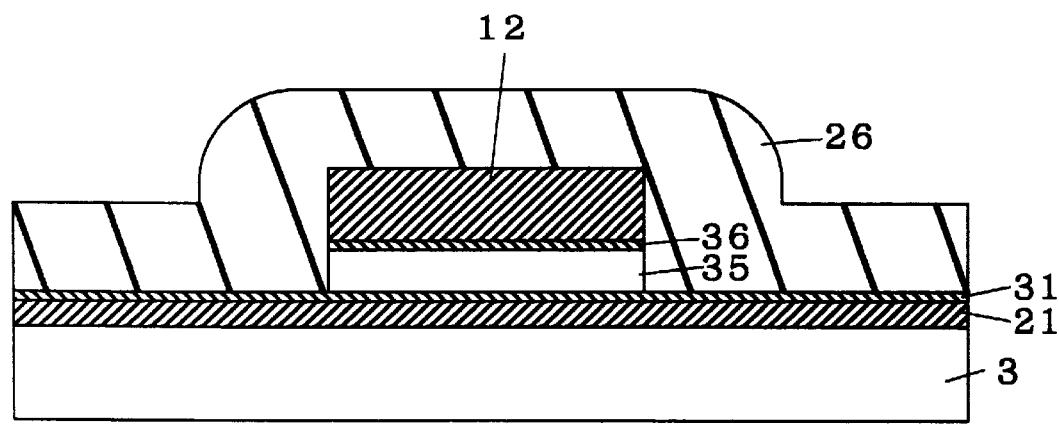
FIG. 22 illustrates a step of fabricating the device according to the embodiment 5 of the present invention.
Figure 23:
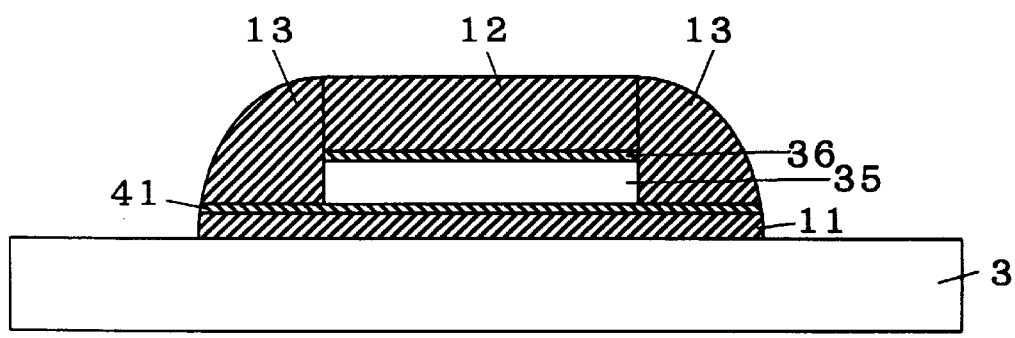
FIG. 23 illustrates a step of fabricating the device according to the embodiment 5 of the present invention.

As shown in the embodiment 4, the reliability of the gate insulating films 14 can be improved by forming the sacrificial oxide films 37 and removing the same. If the number of times for executing dry etching can be reduced, however, it is further preferable since the amount of crystal defects introduced into the SOI layer 3 can be reduced in the first place. FIGS. 21 to 23 are step diagrams showing an example of such a fabrication method.

In this fabrication method, layers from an oxide film 21 up to an oxide layer 23 are successively formed on an SOI layer 3 as shown in FIG. 13, and steps similar to those of FIGS. 2 to 4 are thereafter executed, thereby selectively removing the oxide layer 23, a nitride film 33 and a polysilicon layer 32 by etching, for forming an upper insulating layer 12, a nitride film 36 and a polysilicon layer 35 from the same respectively, as shown in FIG. 21. A nitride film 31 is left unetched.

In case of etching the polysilicon layer 32, only the nitride film 31 can be left by employing an etching method having a selection ratio between polysilicon and SiN. The selection ratio can be increased by employing gas such as $Cl_2$, $CF_4$ or HBr and executing the etching under a low temperature of about 0° C.

Then, an oxide film 26 for forming side walls is deposited along the overall upper surface of the device, as shown in FIG. 22. Thereafter anisotropic etching having a small selection ratio between the oxide film 26 and SiN is performed, thereby forming side walls 13, a nitride film 41 and a lower insulating layer 11 from the oxide film 26, the nitride film 31 and the oxide film 21 respectively, as shown in FIG. 23. The nitride film 41 covers the lower major surface of the polysilicon layer 35 similarly to the nitride film 34 (FIG. 15), and spreads toward surfaces of the side walls 13.

For example, an etching method employing $CF_4$ and CO is employable as the anisotropic etching employed for the step of FIG. 23. In this case, the selection ratio between the oxide film 26 and SiN can be reduced by reducing the percentage of CO. Thereafter steps similar to those of FIGS. 8 to 10 are executed, thereby forming gate insulating films 14 and a gate electrode 6.

In this fabrication method, as hereinabove described, an SOI layer 3 is exposed to an etchant only in the step of FIG. 23 for forming the side walls 13 etc. Therefore, the amount of crystal defects introduced into the gate insulating films 14 can be reduced as compared with the method of the embodiment 3. Therefore, deterioration in characteristics and reliability of the gate insulating films 14 is suppressed.

The method of this embodiment can be further combined with the method of the embodiment 4 forming the sacrificial oxide films 37. For this combination, the steps of FIGS. 17 to 19 may be executed after the step of FIG. 23, so that the steps of FIGS. 9 and 10 are thereafter executed. The amount of crystal defects introduced into the gate insulating films 14 is further lowly suppressed due to the formation of the sacrificial oxide films 37, whereby the characteristics and reliability of the gate insulating films 14 are further improved.

<Embodiment 6>

In the embodiment 4 of the present invention, the side wall surfaces of the edge portions of the polysilicon layer 35 forming the FS electrode 5 are oxidized, to be advantageously inwardly retreated. These side wall surfaces are slightly expanded in volume due to the oxidation. The widths the side wall surfaces, i.e., the thickness of the polysilicon layer 35 is sufficiently small in general, and hence the volume expansion is negligible. If the thickness of the polysilicon layer 35 is set at such a large value that the volume expansion of the side wall surfaces is not negligible, however, not only major surfaces but side wall surfaces of a polysilicon layer 35 may be covered with nitride films 42, as shown in FIG. 24.

Figure 24:
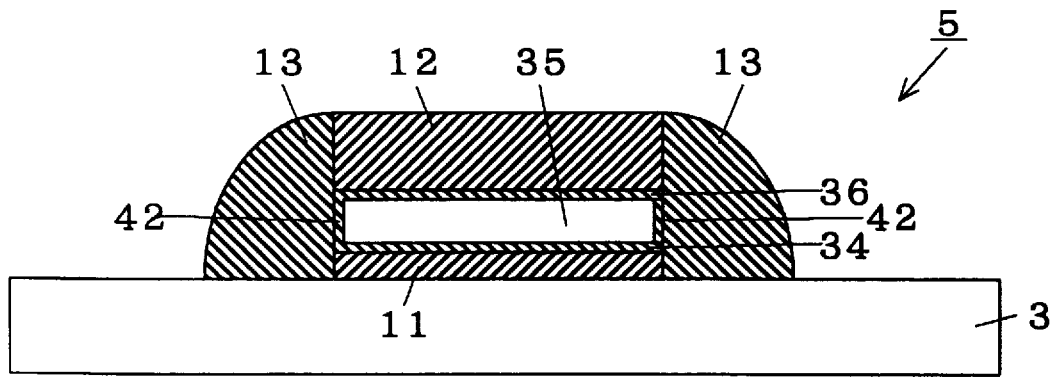
FIG. 24 illustrates a step of fabricating a device according to an embodiment 6 of the present invention.

FIG. 24 is a sectional view showing a device in a state immediately after a step of forming side walls 13. The polysilicon layer 35 is covered not only with nitride films 34 and 36 but with the nitride films 42, whereby its side end surfaces can be prevented from progress of oxidation. Even if the polysilicon layer 35 is thickly formed, therefore, the distance between an FS electrode 5 and a gate electrode 6 can be prevented from being narrowed by volume expansion of the side end surfaces following oxidation. Consequently, the electrostatic capacitance between the FS electrode 5 and the gate electrode 6 is lowly suppressed, while a short trouble hardly takes place.

FIGS. 25 to 28 are step diagrams showing an exemplary method of fabricating the device having the FS electrode 5 in the structure shown in FIG. 24. In this fabrication method, the steps up to that of FIG. 21 of the embodiment 5 are executed. Consequently, an upper insulating layer 12, the nitride film 36 and the polysilicon layer 35 are formed, while the nitride film 31 is left unetched.

Figure 25:
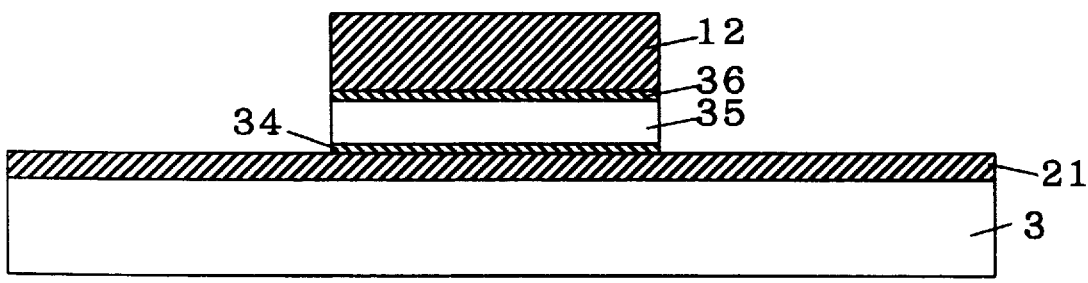
FIG. 25 illustrates a step of fabricating the device according to the embodiment 6 of the present invention.

Then, the nitride film 31 is selectively removed by dry etching, thereby forming the nitride film 34, as shown in FIG. 25. In order to remove the nitride film 31 while leaving only an oxide film 21, dry etching for SiN having a high selection ratio between the same and the oxide film ($SiO_2$) may be executed.

Figure 26:
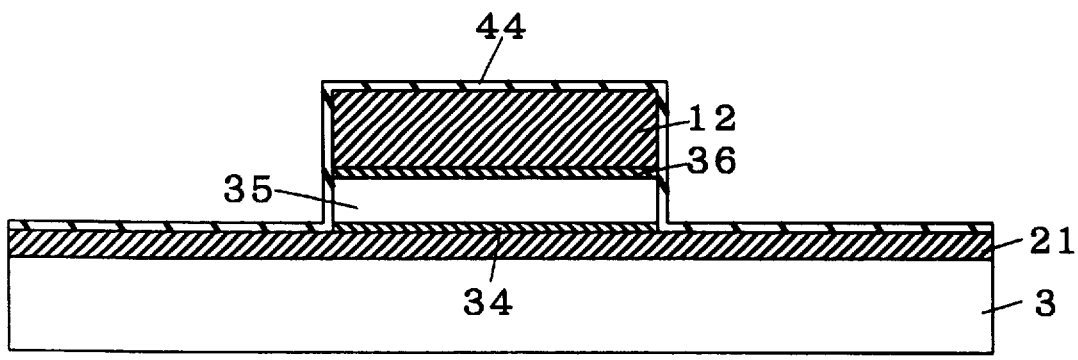
FIG. 26 illustrates a step of fabricating the device according to the embodiment 6 of the present invention.
Figure 27:
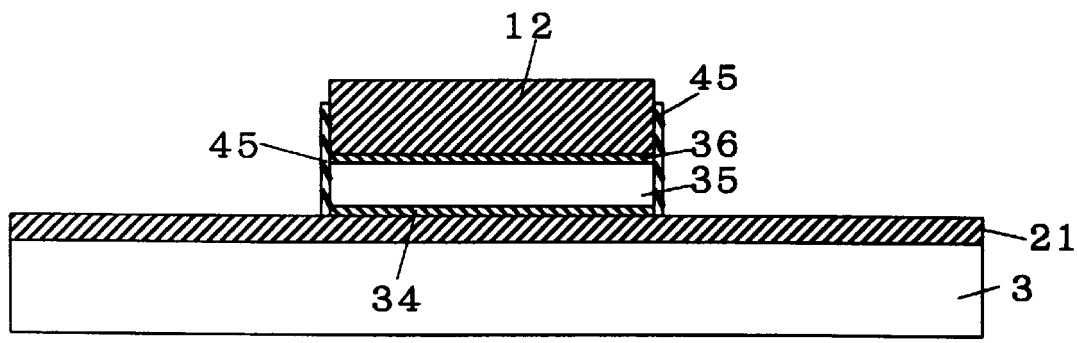
FIG. 27 illustrates a step of fabricating the device according to the embodiment 6 of the present invention.

Then, a nitride film 44 is deposited along the overall upper surface of the device, as shown in FIG. 26. Then, anisotropic etching is executed, thereby selectively removing the nitride film 44, as shown in FIG. 27. In this step, the etching is so performed that the nitride film 44 remains on side wall surfaces of the polysilicon layer 35 as nitride films 45. In order to remove only the nitride film 44 while leaving the oxide film 21, etching employing $Cl_2$ or HBr can be employed. This method is also suitable for removing polysilicon.

Figure 28:
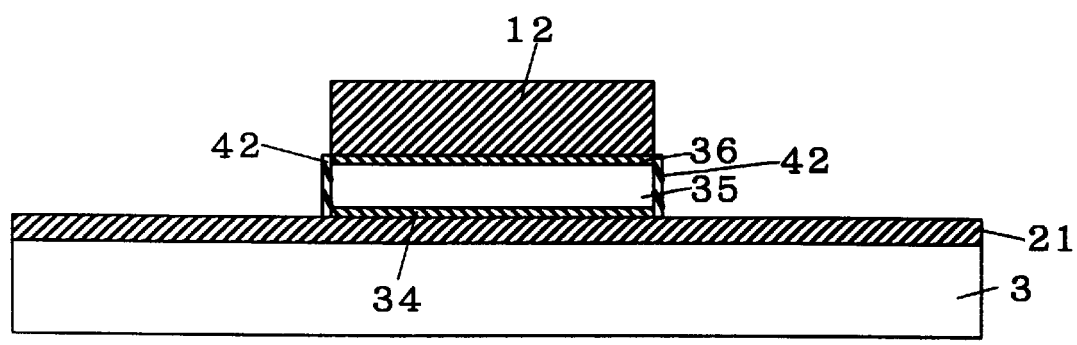
FIG. 28 illustrates a step of fabricating the device according to the embodiment 6 of the present invention.

In order to deposit an oxide film 26 for side walls 13 in a later step, the nitride films 45 must be etched slightly in excess. Due to such overetching, upper ends of the nitride films 45 are slightly retreated downward from the upper surface of the upper insulating layer 12. When the upper ends of the nitride films 45 are further retreated by further excessively executing the overetching, the nitride films 45 remain only on the side wall surfaces of the polysilicon layer 35 as the nitride films 42, as shown in FIG. 28.

Thereafter steps similar to those of FIGS. 22 and 23 are executed, thereby completing the structure shown in FIG. 24. Thereafter steps similar to those of FIGS. 8 to 10 are executed, thereby forming gate insulating films 14 and a gate electrode 6. In place of shifting from the step of FIG. 21 to the step of FIG. 26 through the step of FIG. 25, the step of FIG. 26 may be directly executed after the step of FIG. 21.

In the aforementioned steps, an SOI layer 3 is exposed to dry etching only once similarly to the embodiment 5. Therefore, the amount of crystal defects introduced into the gate insulating films 14 is lowly suppressed, whereby deterioration in characteristics and reliability of the gate insulating films 14 is advantageously inhibited.

Further, a step of forming sacrificial oxide films may be added. In this case, the steps of FIGS. 17 to 19 may be executed after the step of FIG. 24, so that the steps of FIGS. 9 and 10 are thereafter executed. Due to formation of sacrificial oxide films 37, the amount of crystal defects introduced into the gate insulating films 14 is further suppressed, whereby the characteristics and reliability of the gate insulating films 14 are further improved.

<Embodiment 7>

The method according to the embodiment 6 includes the step of retreating the nitride film 45 to positions on the upper ends of the side wall surfaces of the FS electrode 5 by controlling the degree of overetching. On the other hand, it is also possible to form side walls 13 while leaving nitride films 45 on side wall surfaces of an upper insulating layer 12 as shown in FIG. 29, by completing overetching in the state shown in FIG. 27.

Figure 29:
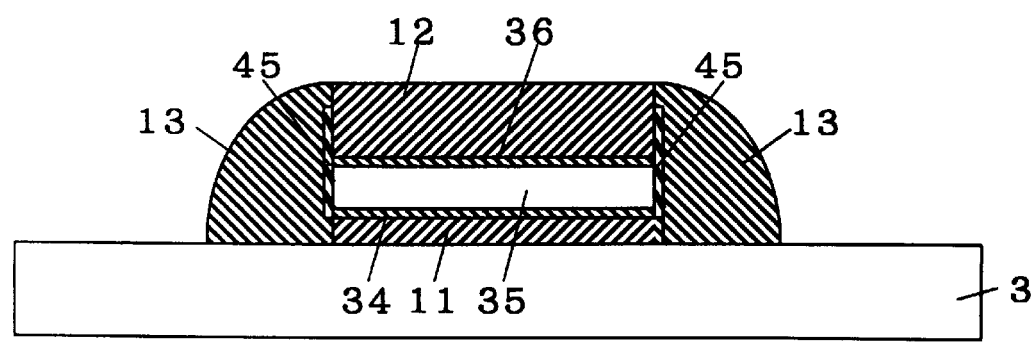
FIG. 29 illustrates a step of fabricating a device according to an embodiment 7 of the present invention.

In order to form the structure shown in FIG. 29, steps identical to those of the embodiment 6 are first executed, to obtain the structure shown in FIG. 27. Thereafter steps similar to those of FIGS. 22 and 23 are executed without performing the step of FIG. 28, thereby completing the structure shown in FIG. 29. Thereafter steps similar to those of FIGS. 8 to 10 are executed, thereby forming gate insulating films 14 and a gate electrode 6.

This fabrication method is easy to execute as compared with the method of the embodiment 6, since overetching may not be precisely controlled. In other words, side wall surfaces of a nitride film 36 forming an FS electrode 5 can be reliably covered with the nitride films 45 without precisely controlling the degree of overetching. Thus, the characteristics of the device are stabilized, while the yield is improved.

<Embodiment 8>

Figure 30:
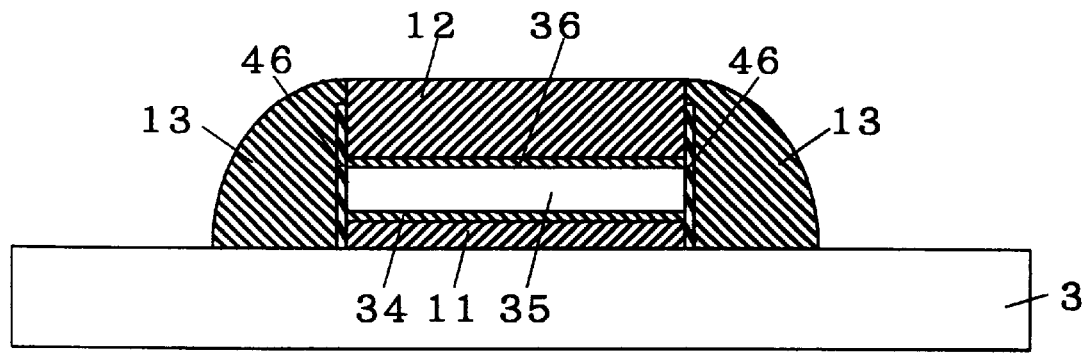
FIG. 30 illustrates a step of fabricating a device according to an embodiment 8 of the present invention.

As shown in FIG. 30, nitride films 46 can be so formed as to cover side wall surfaces of a polysilicon layer 35 while extending lower ends thereof toward a major surface of an SOI layer 3. An example of such a fabrication method is now described.

Figure 31:
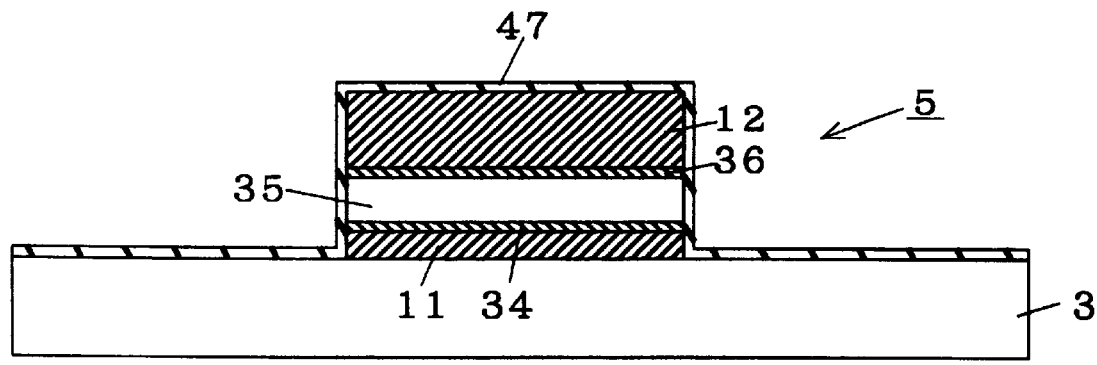
FIG. 31 illustrates a step of fabricating the device according to the embodiment 8 of the present invention.
Figure 32:
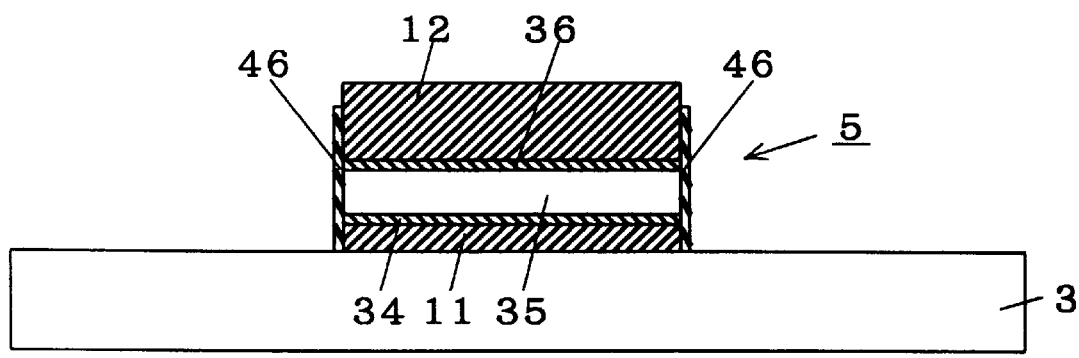
FIG. 32 illustrates a step of fabricating the device according to the embodiment 8 of the present invention.

In order to form the structure shown in FIG. 30, steps identical to those of the embodiment 3 are first executed, to obtain the structure shown in FIG. 14. Thereafter a nitride film 47 is deposited to cover the overall surface of the device as shown in FIG. 31. Then, the nitride film 47 is overetched similarly to the step of FIG. 27, thereby obtaining a structure shown in FIG. 32. Namely, the nitride films 46 are formed from the nitride film 47. The nitride films 46 cover the side wall surfaces of the polysilicon layer 35, as well as those of a lower insulating layer 11 and an upper insulating layer 12, while upper ends thereof are somewhat downwardly retreated from the upper surface of the upper insulating layer 12 and lower ends thereof reach the surface of the SOI layer 3.

Thereafter steps similar to those of FIGS. 6 and 7 are executed, thereby completing the structure shown in FIG. 30. Thereafter steps similar to those of FIGS. 8 to 10 are executed, thereby forming gate insulating films 14 and a gate electrode 6.

Although the SOI layer 3 is exposed to dry etching a larger number of times as compared with the method of the embodiment 6 in the method of this embodiment, two major surfaces and side wall surfaces of the polysilicon layer 35 are still covered with nitride films. Therefore, an effect following this can be attained similarly to the embodiment 6.

Further, the nitride films 46 also cover the side walls of the lower insulating layer 11, thereby suppressing infiltration itself of an oxidant into the lower insulating layer 11 following oxidation. Thus, oxidation of the SOI layer 3, shown by symbol F in FIG. 57, is also suppressed. Therefore, slight deformation of an FS electrode 5 resulting from oxidation of the SOI layer 3 is also advantageously suppressed. Namely, the electrostatic capacitance between the FS electrode 5 and the gate electrode 6 is further reduced as compared with the method of the embodiment 6, while occurrence of a short trouble can be suppressed.

Further, a step of forming sacrificial oxide films may be added. In this case, the steps of FIGS. 17 to 19 may be executed after the step of FIG. 30, so that the steps of FIGS.

9 and 10 are thereafter executed. The amount of crystal defects introduced into the gate insulating films 14 is further suppressed due to formation of the sacrificial oxidation films 37, whereby the characteristics and reliability of the gate insulating films 14 are further improved.

<Embodiment 9>

Figure 33:
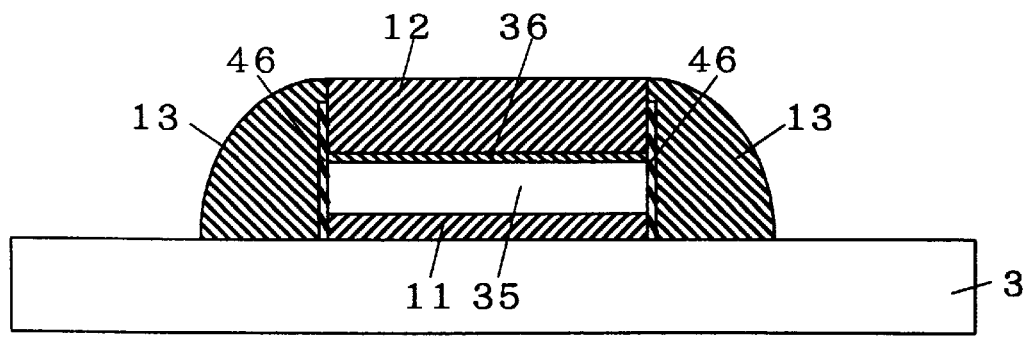
FIG. 33 illustrates a step of fabricating a device according to an embodiment 9 of the present invention.

As already described, the nitride films 46 reach the SOI layer 3, thereby suppressing infiltration of the oxidant into the lower insulating layer 11 following oxidation in the fabrication method according to the embodiment 8. Therefore, oxidation of the lower major surface of the polysilicon layer 35 shown by symbol G in FIG. 57 hardly takes place even if the nitride film 34 covering the lower surface of the polysilicon layer 35 is removed as shown in FIG. 33. An example of such a fabrication method is now described.

Figure 34:
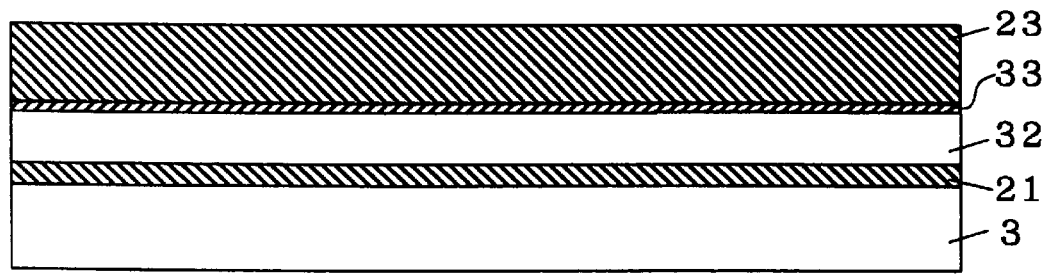
FIG. 34 illustrates a step of fabricating the device according to the embodiment 9 of the present invention.

The structure shown in FIG. 33 is obtained by replacing the step of FIG. 13 with that of FIG. 34 and executing the steps up to FIG. 30 in the embodiment 8. In a step shown in FIG. 34, an oxide film 21, a polysilicon layer 32, a nitride film 33 and an oxide layer 23 are successively formed on an SOI layer 3 in this order. Namely, the step of FIG. 34 is characteristically different from that of FIG. 13 in a point that no nitride film 31 is formed. After the step of FIG. 34, steps similar to those of FIGS. 8 to 10 are executed, thereby forming gate insulating films 14 and a gate electrode 6.

No nitride film 34 is formed in the fabrication method of this embodiment, whereby fabrication is simplified as compared with the embodiment 8, and the fabrication cost can be reduced.

<Embodiment 10>

Figure 35:
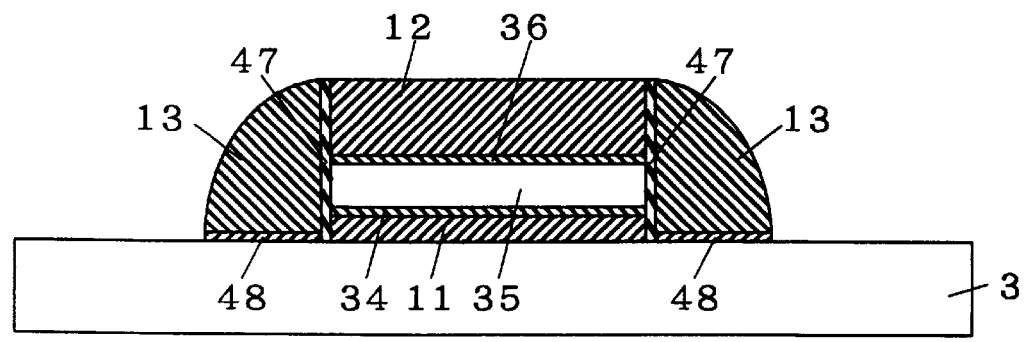
FIG. 35 illustrates a step of fabricating a device according to an embodiment 10 of the present invention.

FIG. 35 is a sectional view showing a device in a state immediately after a step of forming side walls 13 in a fabrication method according to an embodiment 10 of the present invention. While nitride films 47 are formed to cover side wall surfaces of upper and lower insulating layers 12 and 11 similarly to the embodiment 8, this embodiment is characteristically different from the structure shown in FIG. 30 in a point that nitride films 48 are formed on an SOI layer 3 in portions immediately under the side walls 13.

Figure 36:
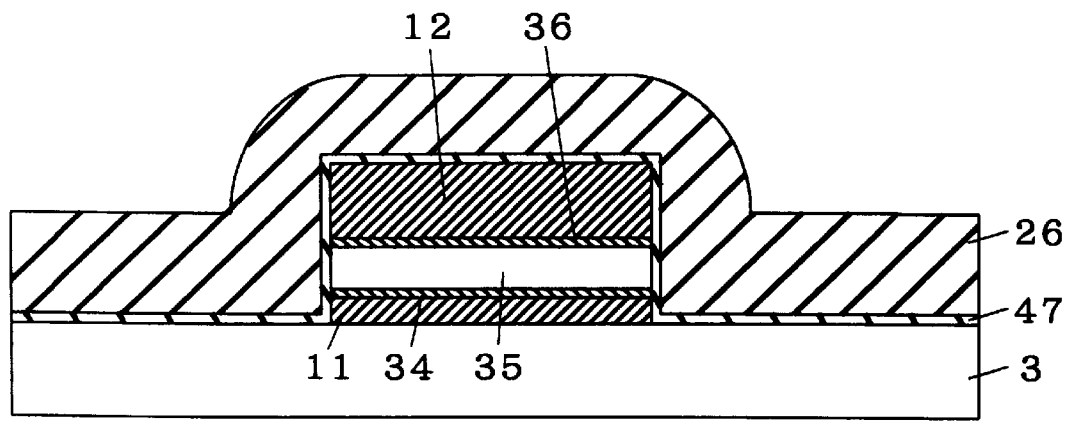
FIG. 36 illustrates a step of fabricating the device according to the embodiment 10 of the present invention.
Figure 37:
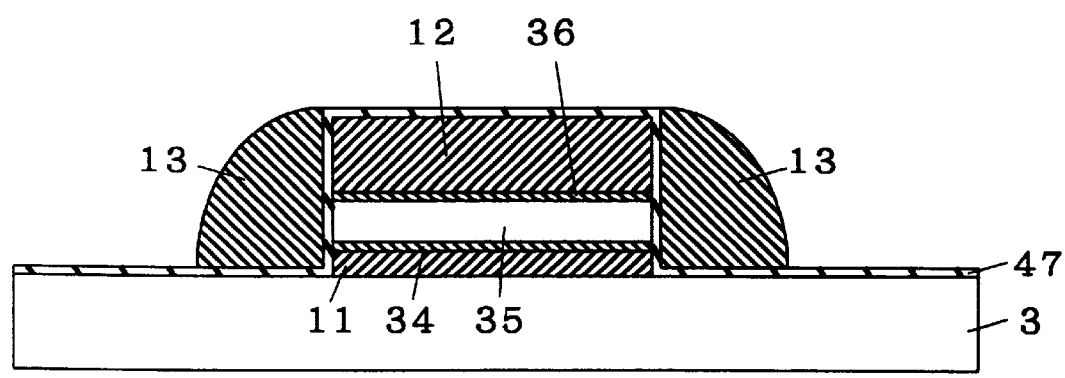
FIG. 37 illustrates a step of fabricating the device according to the embodiment 10 of the present invention.

In order to form the structure shown in FIG. 35, steps identical to those of the embodiment 8 are first executed, to obtain the structure shown in FIG. 31. Thereafter an oxide film 26 for the side walls 13 is deposited to cover the overall upper surface of the device without etching the nitride films 47, as shown in FIG. 36. Then, anisotropic dry etching is performed to form the side walls 13 from the oxide film 26, as shown in FIG. 37. At this time, the nitride films 47 are not removed but remain.

In order to selectively remove the oxide film 26 while leaving the nitride films 47, dry etching employing $CF_4$ and CO, for example, may be executed. The selection ratio between the oxide film 26 and the nitride films 47 can be increased by increasing the percentage of CO.

Then, wet etching is performed to remove portions of the nitride films 47 exposed outside the side walls 13, thereby obtaining the structure shown in FIG. 35. Phosphoric acid of 100 to 200° C., for example, may be employed for this wet etching. Thereafter steps similar to those of FIGS. 8 to 10 are executed, thereby forming gate insulating films 14 and a gate electrode 6.

In the method of this embodiment, two major surfaces and side wall surfaces of a polysilicon layer 35 are covered with nitride films, similarly to the embodiment 6. Further, the SOI layer 3 is exposed to dry etching only once, also similarly to the embodiment 6. Therefore, an effect similar to that of the embodiment 6 can be attained.

Figure 38:
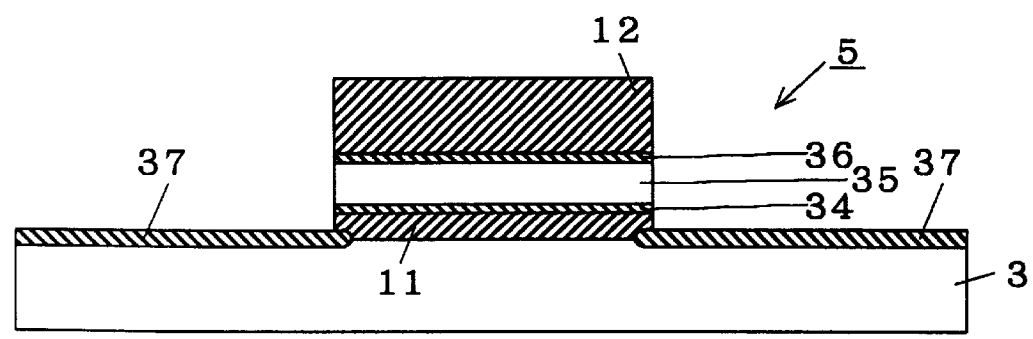
FIG. 38 illustrates a step of fabricating the device according to the embodiment 10 of the present invention.

Further, a step of forming sacrificial oxide films may be added. In this case, sacrificial oxide films 37 may be formed on the SOI layer 3 as shown in FIG. 38 after the step of FIG. 14, before executing the step of FIG. 31. A step similar to that of FIG. 17 may be executed, in order to form the sacrificial oxide films 37.

Figure 39:
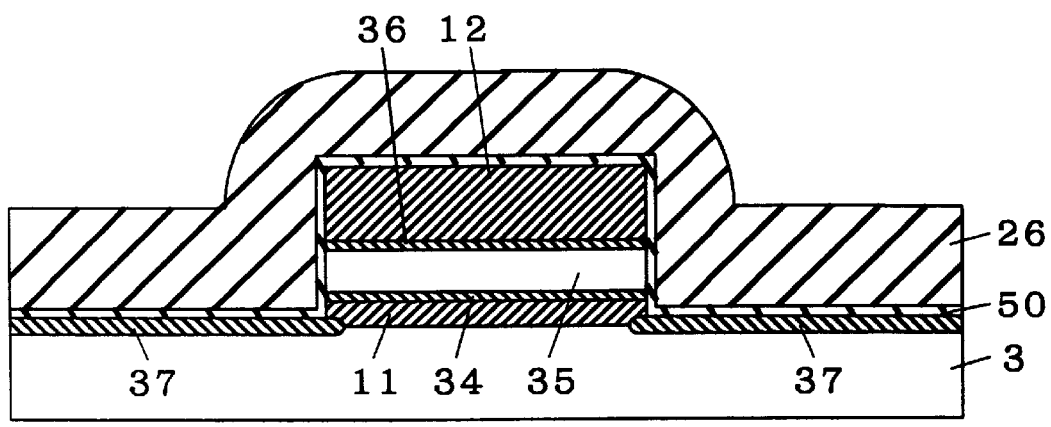
FIG. 39 illustrates a step of fabricating the device according to the embodiment 10 of the present invention.
Figure 40:
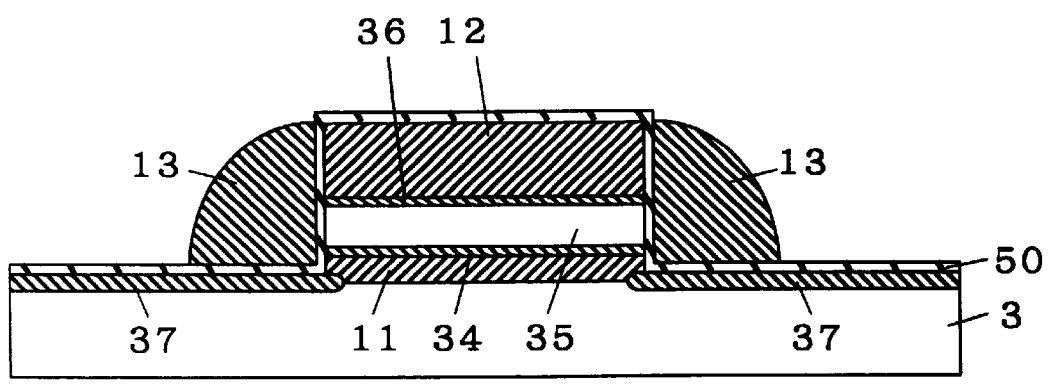
FIG. 40 illustrates a step of fabricating the device according to the embodiment 10 of the present invention.

Thereafter a nitride film 50 is formed on the overall upper surface of the device, and an oxide film 26 is further deposited thereon, as shown in FIG. 39. Then, etching is executed similarly to the step of FIG. 37, thereby forming the side walls 13 while leaving nitride films 50, as shown in FIG. 40.

Figure 41:
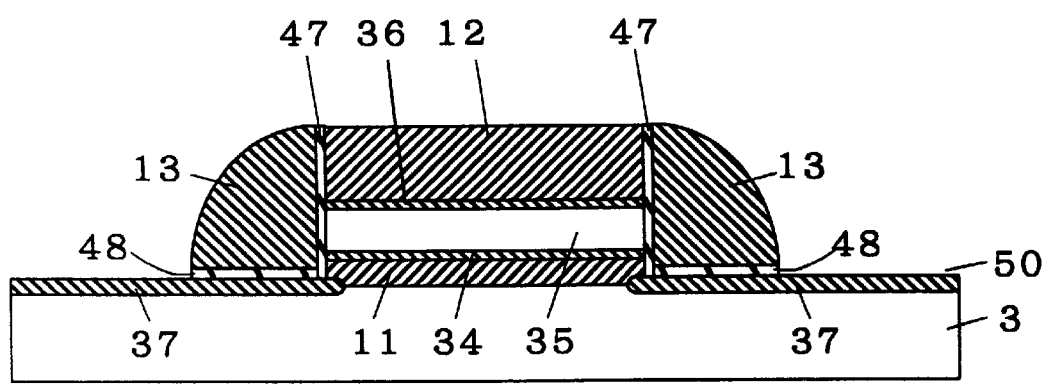
FIG. 41 illustrates a step of fabricating the device according to the embodiment 10 of the present invention.
Figure 42:
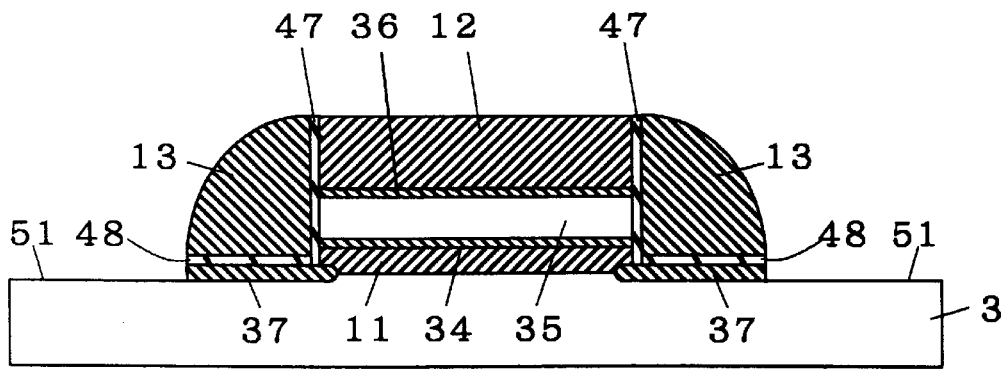
FIG. 42 illustrates a step of fabricating the device according to the embodiment 10 of the present invention.

Then, wet etching is performed similarly to the step of FIG. 35, thereby removing exposed portions of the nitride films 50, as shown in FIG. 41. Namely, the nitride films 47 and 48 are formed from the nitride films 50. Thereafter a step similar to that of FIG. 18 is executed, thereby removing the sacrificial oxide films 37. Consequently, new surfaces (retreated surfaces) 51 somewhat retreated from the original upper major surface of the SOI layer 3 toward deep portions are exposed, as shown in FIG. 42.

Figure 43:
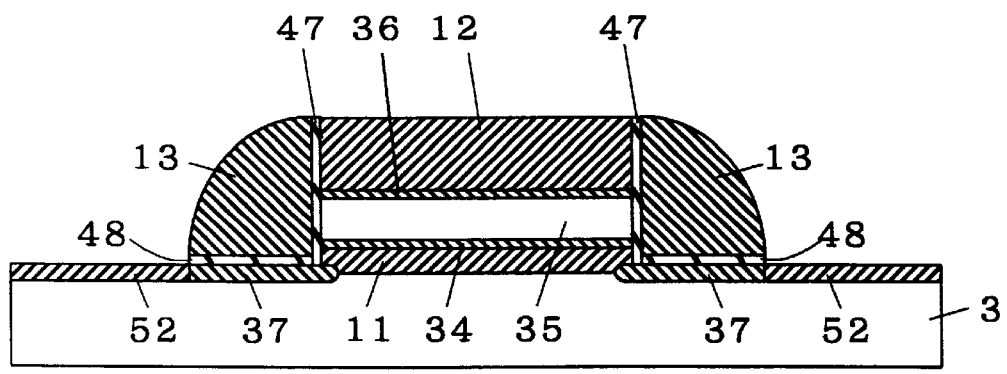
FIG. 43 illustrates a step of fabricating the device according to the embodiment 10 of the present invention.

Then, a step similar to that of FIG. 19 is executed, thereby forming gate insulating films 52, as shown in FIG. 43. Thereafter the steps of FIGS. 9 and 10 are executed, for forming a gate electrode 6. The amount of crystal defects introduced into the gate insulating films 14 is further suppressed due to the formation of the sacrificial oxide films 37, whereby the characteristics and reliability of the gate insulating films 14 are further improved.

<Embodiment 11>

Also in the structure of the embodiment 10 shown in FIG. 35, the nitride films 47 reach the SOI layer 3, thereby suppressing infiltration of an oxidant into the lower insulating layer 11 following oxidation. Even if a nitride film 34 covering a lower major surface of a polysilicon layer 35 is removed as shown in FIG. 44, therefore, oxidation of the lower major surface of the polysilicon layer 35 shown by symbol G in FIG. 57 hardly takes place.

Figure 44:
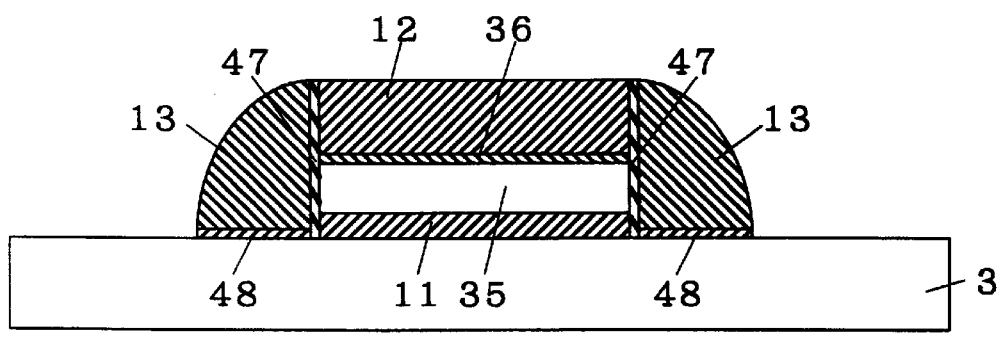
FIG. 44 illustrates a step of fabricating a device according to an embodiment 11 of the present invention.

The structure shown in FIG. 44 is obtained by replacing the step of FIG. 13 with that of FIG. 34 and executing the steps up to FIG. 35 in the embodiment 10. Steps similar to those of FIGS. 8 to 10 are executed after the step of FIG. 44, thereby forming gate insulating films 14 and a gate electrode 6.

No nitride film 34 is formed in the fabrication method of this embodiment, whereby fabrication is simplified as compared with the embodiment 8, and the fabrication cost can be reduced.

<Embodiment 12>

While the SOI layer 3 is exposed to dry etching only once in each of the embodiments 5, 6 and 10, it is further preferable if the SOI layer 3 is never exposed to dry etching. An example of such a fabrication method is now described.

Figure 45:
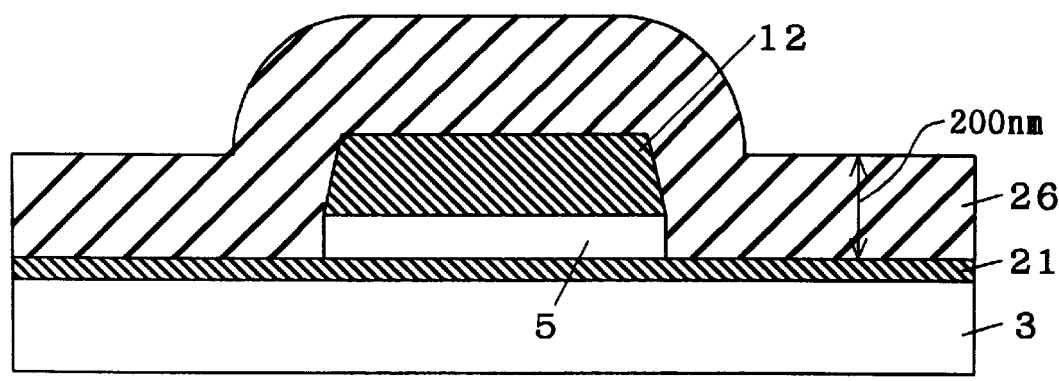
FIG. 45 illustrates a step of fabricating a device according to an embodiment 12 of the present invention.
Figure 46:
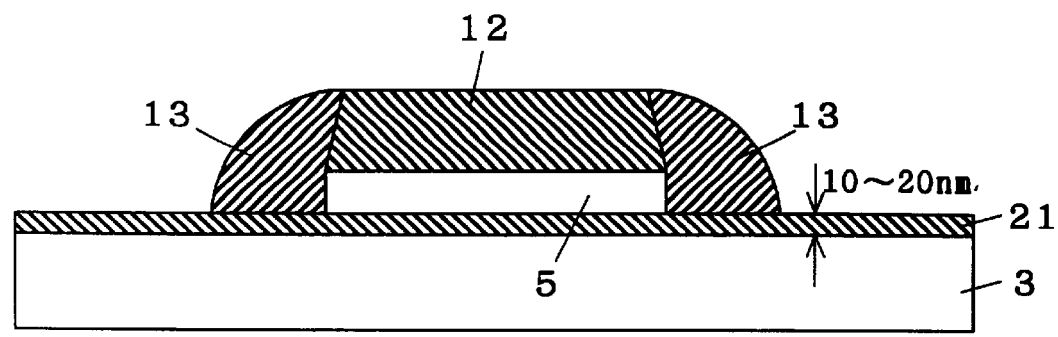
FIG. 46 illustrates a step of fabricating the device according to the embodiment 12 of the present invention.

In this fabrication method, an oxide film 26 is deposited by about 200 nm, for example, after completing the step of FIG. 4, thereby obtaining a structure shown in FIG. 45. Then, dry etching is performed to form side walls 13 from the oxide film 26, as shown in FIG. 46. At this time, partial etching is executed, to leave an oxide film 21 in a thickness of about 10 to 20 nm on the SOI layer 3, as shown in FIG. 46.

Figure 47:
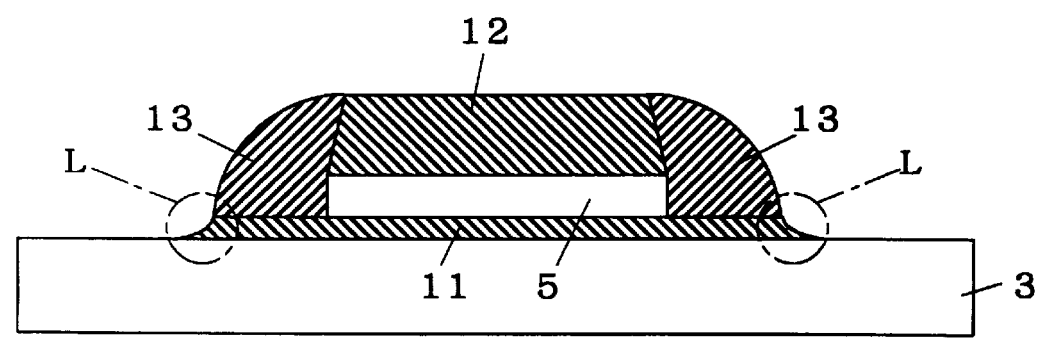
FIG. 47 illustrates a step of fabricating the device according to the embodiment 12 of the present invention.

For such partial etching, a method such as that employing $CF_4$ and CO, for example, identical to dry etching for removing an oxide film ($SiO_2$) is employed. The etching is stopped before exposing the surface of the SOI layer 3. Then, wet etching is executed, to remove exposed portions of the oxide film 21. Consequently, a structure shown in FIG. 47 is obtained. Thereafter the steps of FIGS. 8 to 10 are executed, thereby forming gate insulating films 14 and a gate electrode 6.

As hereinabove described, the SOI layer 3 is never exposed to dry etching in this fabrication method. Thus, the amount of crystal defects introduced into the gate insulating films 14 is further suppressed, whereby the characteristics and reliability of the gate insulating films 14 are further improved such that a source-to-drain leakage current is remarkably reduced. Further, no depressed portions 17 are formed dissimilarly to the prior art shown in FIG. 50, whereby no problems result from such depressed portions 17.

Further, wet etching is employed in the final stage of the step of etching the oxide film 26 for forming the side walls 13, whereby bottom portions of the surfaces of the side walls 13 which are in contact with the SOI layer 3 are concaved to be smoothly connected with the surface of the SOI layer 3, as shown by circular frames L in FIG. 47. Thus, it is possible to advantageously relieve such a phenomenon that an electric field generated by the gate electrode 6 formed on the bottom portion through one gate insulating film 14 concentrates to the bottom portion. This also contributes to reduction of the source-to-drain leakage current.

This embodiment employs partial etching and wet etching, and hence a lower insulating layer 11 and the side walls 13 are preferably equalized in film quality with each other. At least the etching rates are preferably equalized with each other. To this end, the lower insulating layer 11 and the side walls 13 may be formed by the same CVD methods at the same CVD temperatures, for example.

Further, the steps up to FIG. 4 may be replaced with those up to FIG. 28 in the embodiment 6, for example, so that an FS electrode 5 is enclosed with nitride films 34, 36 and 42, similarly to the embodiment 6. Namely, the aforementioned embodiments can be properly combined with each other.

<Modifications>

(1) In each of the aforementioned embodiments, the nitride films (SiN films) such as the nitride films 34, 36, 42, 45 and 46 can be replaced with oxidation-resistant films in general. For example, the nitride films may be replaced with SiON films. SiON films can advantageously relieve stress in the films, in particular.

Figure 48:
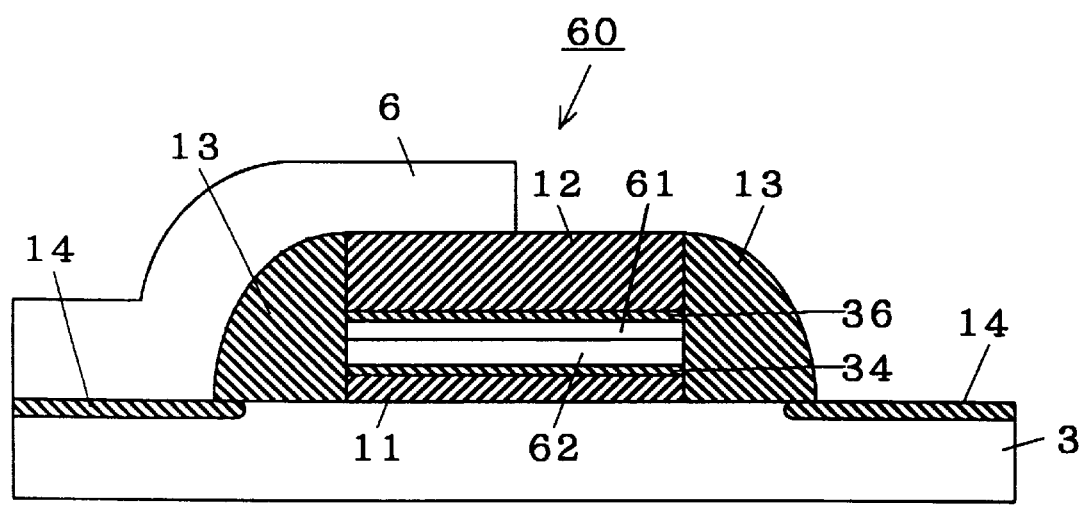
FIG. 48 illustrates a step of fabricating a device according to a modification.
Figure 49:
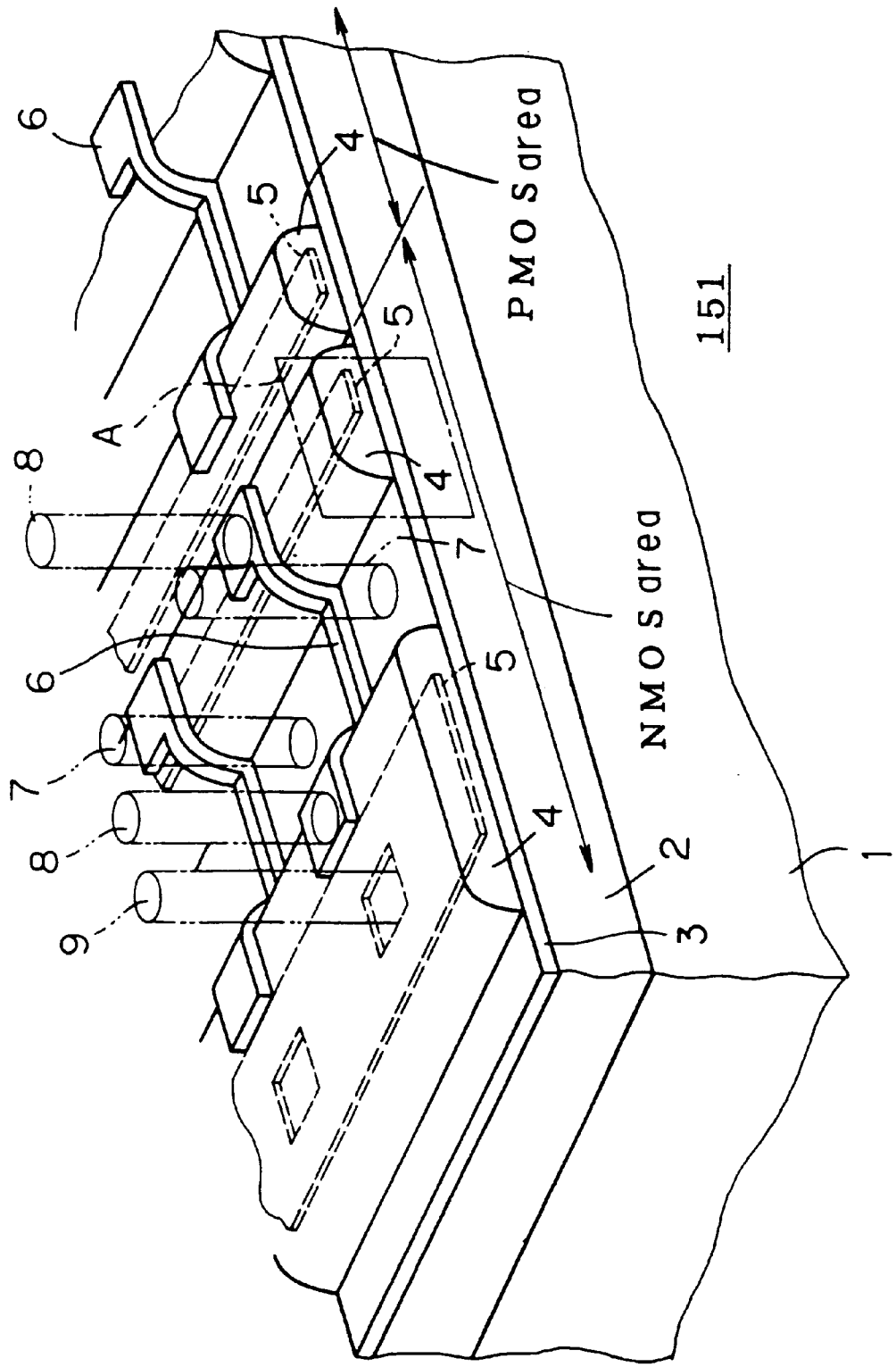
FIG. 49 is a sectional perspective view showing a conventional device.

(2) The FS electrode 5 and the gate electrode 6 are made of polysilicon in each of the aforementioned embodiments. However, the materials for these electrodes are not restricted to polysilicon, in general. For example, the polysilicon layer 35 forming the FS electrode 5 may be replaced with a polycide layer 60 having a multilayer structure of a tungsten silicide (WSi) layer 61 and a polysilicon layer 62 as shown in a sectional view of FIG. 48, for example. In order to obtain such a structure, a polycide layer may be deposited in place of the polysilicon layer 32 in the step of FIG. 13, for example.

(3) Each of the above embodiments has been described with reference to a semiconductor device of an SOI structure. However, the structure formed on the SOI layer 3 characterizing each embodiment can be similarly formed even if the SOI layer 3 is replaced with a bulk semiconductor substrate. In other words, the characteristics of each embodiment are also applicable to a bulk semiconductor device.

(4) Each of the above embodiments has been described with reference to such a structure that the FS electrode 5 and the gate electrode 6 opposed to the SOI layer 3 are insulated from each other by the FS insulating layer 4. However, the characteristics of each embodiment are applicable to such a structure that two electrodes opposed to a semiconductor layer (including a bulk semiconductor substrate) through an oxide insulating film are electrically insulated from each other by an oxide insulating layer in general.

While the invention has been shown and described in detail, the foregoing description is in all aspects illustrative and not restrictive. It is therefore understood that numerous modifications and variations can be devised without departing from the scope of the invention.

We claim:

1. A semiconductor device, comprising:

a semiconductor layer;

first and second oxide insulating films;

an oxide insulating layer;

upper and lower protective films; and first and second electrodes formed opposite to a major surface of the semiconductor layer through the first and second oxide insulating films, respectively, said first and second electrodes being electrically insulated from each other through the oxide insulating layer formed so as to cover said second electrode, said second electrode including a flat plate type conductor having a lower major surface formed opposite to said major surface of said semiconductor layer and an upper major surface formed opposite to the lower major surface, the upper and lower protective films being oxidation-resistant films suppressing an oxidant from infiltrating therethrough and formed so as to cover said upper and lower major surfaces of said flat plate type conductor, respectively, said semiconductor device further comprises a side protective film which is an oxidation-resistant film formed so as to entirely cover a side wall surface of said flat plate type conductor, said side protective film is formed so as to extend toward and be in contact with said major surface of said semiconductor layer, and said first electrode has a portion formed over at least a portion of said upper major surface of said flat plate type conductor.

2. The semiconductor device in accordance with claim 1, wherein said side protective film extends upwardly beyond said upper major surface of the second electrode in said oxide insulating layer.

3. The semiconductor device in accordance with claim 1, wherein said major surface of said semiconductor layer is formed as a retreated surface from remaining portions thereof by sacrificial oxidation in a region provided with said first oxide insulating film.

4. The semiconductor device in accordance with claim 1, wherein said oxidation-resistant films each have a nitride film.

* * * * *